United States Patent
Mehrabi et al.

(10) Patent No.: US 10,065,209 B2
(45) Date of Patent: *Sep. 4, 2018

(54) FUNCTIONAL MICRO- AND/OR NANO-STRUCTURE BEARING CONSTRUCTIONS AND/OR METHODS FOR FABRICATING SAME

(71) Applicant: Avery Dennison Corporation, Glendale, CA (US)

(72) Inventors: Ali R. Mehrabi, Glendale, CA (US); Nagarajan Srivatsan, Arcadia, CA (US); Reza Mehrabi, Tujunga, CA (US); Christine Dang, Garden Grove, CA (US); Ekaterina Vaskova, Woodside, CA (US)

(73) Assignee: Avery Dennison Corporation, Glendale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/745,667

(22) Filed: Jun. 22, 2015

(65) Prior Publication Data
US 2015/0283578 A1 Oct. 8, 2015

Related U.S. Application Data

(62) Division of application No. 12/933,168, filed as application No. PCT/US2009/037455 on Mar. 17, 2009, now Pat. No. 9,061,892.

(Continued)

(51) Int. Cl.
*B05D 1/16* (2006.01)
*B05D 1/14* (2006.01)
(Continued)

(52) U.S. Cl.
CPC ............ *B05D 1/16* (2013.01); *B05D 1/12* (2013.01); *B05D 1/14* (2013.01); *B81C 1/00206* (2013.01);
(Continued)

(58) Field of Classification Search
CPC .... B05D 1/16; B05D 1/12; B05D 1/14; B81C 1/00; B81C 3/00; B81C 1/00206; Y10T 156/1043
(Continued)

(56) References Cited

U.S. PATENT DOCUMENTS 6,737,160 B1 5/2004 Full et al.
7,056,409 B2 6/2006 Dubrow
(Continued)

FOREIGN PATENT DOCUMENTS

JP 59047445 A * 3/1984
JP 61179382 A * 8/1986
(Continued)

OTHER PUBLICATIONS

International Preliminary Report on Patentability issued in corresponding International Application No. PCT/US2009/037455 dated Sep. 21, 2010.
(Continued)

*Primary Examiner* — Cheryl Ann Juska
(74) *Attorney, Agent, or Firm* — Avery Dennison Corporation

(57) ABSTRACT

A method is provided for fabricating a construction (10) having a functional side (12). The method includes the steps of: supplying a flexible substrate (20); attaching one or more structures (30) to the substrate (20) on a surface or side thereof facing the functional side (12) of the construction (10); and forming one or more features, for example, such as fibrils (39), on at least one of the structures (30), wherein the
(Continued)

features have at least one dimension which is at least one of micro-sized or nano-sized.

12 Claims, 9 Drawing Sheets

Related U.S. Application Data

(60) Provisional application No. 61/037,261, filed on Mar. 17, 2008.

(51) Int. Cl.
  *B05D 1/12* (2006.01)
  *B81C 1/00* (2006.01)
  *F16B 5/07* (2006.01)

(52) U.S. Cl.
  CPC ............ *F16B 5/07* (2013.01); *Y10T 156/1043* (2015.01); *Y10T 428/23943* (2015.04)

(58) Field of Classification Search
  USPC ....... 428/90, 92, 88; 427/180, 206; 156/221, 156/72, 297, 155; 977/882, 888
  See application file for complete search history.

(56) References Cited

U.S. PATENT DOCUMENTS

| | | |
|---|---|---|
| 7,169,250 B2 | 1/2007 | Kim et al. |
| 7,811,272 B2 | 10/2010 | Lindsay et al. |
| 8,066,967 B2 | 11/2011 | Eberlein et al. |
| 8,551,353 B2 | 10/2013 | Kim et al. |
| 2003/0208888 A1 | 11/2003 | Fearing et al. |
| 2004/0071870 A1 | 4/2004 | Knowles et al. |
| 2004/0206448 A1 | 10/2004 | Dubrow |
| 2004/0250950 A1 | 12/2004 | Dubrow |
| 2005/0148984 A1* | 7/2005 | Lindsay .............. A61F 13/5611 604/387 |
| 2005/0163997 A1 | 7/2005 | Van Trump et al. |
| 2005/0181629 A1 | 8/2005 | Jagota et al. |
| 2006/0005362 A1 | 1/2006 | Arzt et al. |
| 2006/0024499 A1* | 2/2006 | Kim ....................... B82Y 10/00 428/401 |
| 2006/0213599 A1 | 9/2006 | Knowles et al. |
| 2006/0219689 A1 | 10/2006 | Huang et al. |
| 2006/0237126 A1* | 10/2006 | Guffrey ...................... C09J 7/02 156/265 |
| 2008/0023125 A1 | 1/2008 | Arnold et al. |
| 2008/0280085 A1 | 11/2008 | Livne |
| 2008/0286251 A1* | 11/2008 | Platt ................... A61K 31/5575 424/93.41 |
| 2008/0286521 A1 | 11/2008 | Eberlein et al. |
| 2009/0041986 A1 | 2/2009 | Zhang et al. |
| 2010/0319111 A1 | 12/2010 | Berns et al. |
| 2011/0081521 A1 | 4/2011 | Kim et al. |
| 2012/0107570 A1 | 5/2012 | Ross et al. |
| 2013/0008055 A1 | 1/2013 | Berns |
| 2016/0133352 A1* | 5/2016 | Hashimoto ......... H01L 23/3737 428/141 |

FOREIGN PATENT DOCUMENTS

| | | |
|---|---|---|
| JP | 63280625 A * | 11/1988 |
| WO | 2004/094303 | 11/2004 |
| WO | 2005/065619 | 7/2005 |
| WO | 2009/002644 | 12/2008 |

OTHER PUBLICATIONS

Corrected International Search Report and Written Opinion issued in corresponding International Application No. PCT/US2009/037455 dated Aug. 6, 2010.
Invitation to Pay Additional Fees issued in corresponding International Application No. PCT/US2009/037455 dated Apr. 27, 2010.
International Search Report and Written Opinion issued in corresponding International Application No. PCT/US2009/037455 dated Aug. 6, 2010.
Handbook of Technical Textiles, AR Horrocks and SC Anand (ed), Woodhead Publishing, Cambridge, England (2000).

* cited by examiner

Multi-Component INS Fiber

FUNCTIONAL MICRO- AND/OR NANO-STRUCTURE BEARING CONSTRUCTIONS AND/OR METHODS FOR FABRICATING SAME

CROSS-REFERENCE TO RELATED APPLICATIONS

The present application is a division of U.S. patent application Ser. No. 12/933,168 filed on Sep. 17, 2010, which is a 371 of International Application No. PCT/US2009/037455, which was published in English on Sep. 24, 2009, and further claims the benefit of U.S. Provisional Application No. 61/037,261 filed Mar. 17, 2008, all of which are incorporated herein by reference in their entireties.

TECHNICAL FIELD

The present inventive subject matter relates generally to the art of micro- and/or nano-structure supporting surfaces. Particular relevance is found in connection with bio-mimetic and/or other particular functional surfaces, and accordingly the present specification makes specific reference thereto. However, it is to be appreciated that aspects of the present inventive subject matter are also equally amenable to other like applications.

BACKGROUND

Functional surfaces that mimic surfaces found in nature include dry adhesive surfaces (i.e., gecko-mimetic surfaces), superhydrophilic surfaces (i.e., anti-fog surfaces), superhydrophobic water repellant surfaces (i.e., lotus leaf-mimetic surfaces), heat and light responsive surfaces, drag reducing surfaces (i.e., shark skin-mimetic surfaces), etc. In general, such surfaces have apparent utility and/or well established commercial potential. The particular functionality exhibited by any one of the various surfaces previously mentioned is often influenced by the specific type of and/or pattern formed by nano- and/or micro-structures arranged and/or supported on the respective surface. The function may also depend on the dimensions of these structures and/or patterns and/or the material characteristics of the structures.

For example, with regard to surface patterns and/or structures:
1) the foot of a gecko generally has a large plurality of hairs extending from and oriented at specific angles (e.g., perpendicular) with respect to an underlying and/or supporting surface, said hairs typically have diameters and lengths of about 5 and 100 microns, respectively—each hair is also generally split or divided at the distal end (i.e., the end away from or opposite the surface contacting end) into hundreds of finer hairs with diameters and lengths of about 0.1 and 10 microns, respectively;
2) the surface of a lotus leaf typically contains protrusions having diameters of about 10 microns, with additional structures having diameters of about 1 micron located on these protrusions; and
3) the surface of shark skin generally contains scales with dimensions of about 50-100 microns that protrude from the surface.

In any event, desirable functions in numerous instances are generally a consequence of the micro- and/or nano-sized features and/or structures arranged and/or supported on the underlying surface. The particular function exhibited is generally influenced by one or more of the following factors: the dimensions of the micro-/nano-sized features or structures, the type and/or form of feature or structures, the material characteristics of the features or structures, the arrangement or pattern of the features or structures on the underlying and/or supporting surface, and the orientation of the features or structures with respect to the underlying and/or supporting surface, i.e., the specific angle(s) at which the features or structures are arranged and/or supported on the underlying surface (e.g., roughly perpendicular).

Adhesive systems of fauna (e.g., such as that of the foot of geckos) can consist of structured protruding fibers with dimensions ranging from a few hundred nanometers to a few microns, and some such fiber based "adhesive" systems are capable of dry operation, e.g., as in the case of geckos and certain spiders. Gecko adhesion is one example of a naturally occurring fiber based dry adhesion. Gecko feet adhere to substrates with a diverse range of chemical compositions and topologies. The adhesion characteristics are maintained under water and in vacuum. The feet are self-cleaning, non-self-adhesive and form reversible bonds with surfaces to which they are adhered. The "adhesive" elements on Gecko feet are comprised of micro-scale fibers called setae that further branch at the ends into hundreds of nano-scale fibrils. Such hierarchical architectures ensure compliance and conformability of the adhesive system over a large array of length scales thereby facilitating intimate contact between the terminal contacting elements and contacted surfaces. Studies indicate that complete contact of all adhesive elements present on Gecko feet with a substrate would yield a bond capable of withstanding 1300 N of shear (parallel to substrate) force and 260 N of adhesive (perpendicular to substrate) force.

Nevertheless, high quality synthetic fiber based dry adhesive systems exhibiting multilevel hierarchical organizations are relatively difficult to fabricate. That is to say, while hierarchical organized architectures, i.e., exhibiting branching and/or progressive reduction in scale (e.g., from micrometer to nanometer size features) are characteristic of natural fiber based dry adhesive systems, heretofore, sufficiently high quality synthetic based systems mimicking the natural fiber based dry adhesive systems and/or suitably efficient and/or easy methods for manufacturing the same have not been developed.

Accordingly, a new and/or improved functional construction with micro- and/or nano-sized surface features or structures and/or a manufacturing method for the same is disclosed which addresses the above-referenced problems and/or others.

SUMMARY

In accordance with one or more selected embodiments disclosed herein, methods are provided for the fabrication of surfaces with micrometer and/or nanometer sized features oriented roughly perpendicular or at a pre-determined angle to the surface. Practical applications for these surfaces include, but are not limited, bio-mimetic adhesives such as gecko-type adhesives, superhydrophilic and lotus-leaf like superhydrophobic materials, heat responsive surfaces and drag reducing shark-skin like surfaces, etc. The methods can be readily scaled for substantially continuous on web manufacture of the aforementioned surfaces.

One disclosed method involves the use of electric and/or magnetic fields to obtain surfaces with oriented anisotropic micron or nanometer sized particles, e.g., such as micro- or nano-fibers, rods and tubes. In particular, electrostatic flocking is used in one embodiment to implant fibers, tubes, rods, etc. at a desired orientation to the surface. In one embodiment, the surface is coated with a layer of an adhesive and then subjected to electrostatic flocking, and the adhesive is then cured or dried.

In one suitable embodiment, a method is provided for fabricating a construction having a functional side. The method includes the steps of: supplying a flexible substrate; attaching one or more structures to the substrate on a surface or side thereof facing the functional side of the construction; and forming one or more features, for example, such as fibril, on at least one of the structures, wherein the features have at least one dimension which is at least one of micro-sized or nano-sized.

In another suitably embodiment, a construction having a functional side is provided. The construction includes: a flexible substrate having a surface facing the functional side of the construction; one or more structures attached to the surface of the substrate; and one or more features formed on at least one of the structures, the features having at least one dimension which is at least one of micro-sized or nano-sized.

Numerous advantages and benefits of the inventive subject matter disclosed herein will become apparent to those of ordinary skill in the art upon reading and understanding the present specification.

BRIEF DESCRIPTION OF THE DRAWINGS

The inventive subject matter disclosed herein may take form in various components and arrangements of components, and in various steps and arrangements of steps. The drawings are only for purposes of illustrating preferred embodiments and are not to be construed as limiting. Further, it is to be appreciated that the drawings may not be to scale.

DETAILED DESCRIPTION

Figure 1:
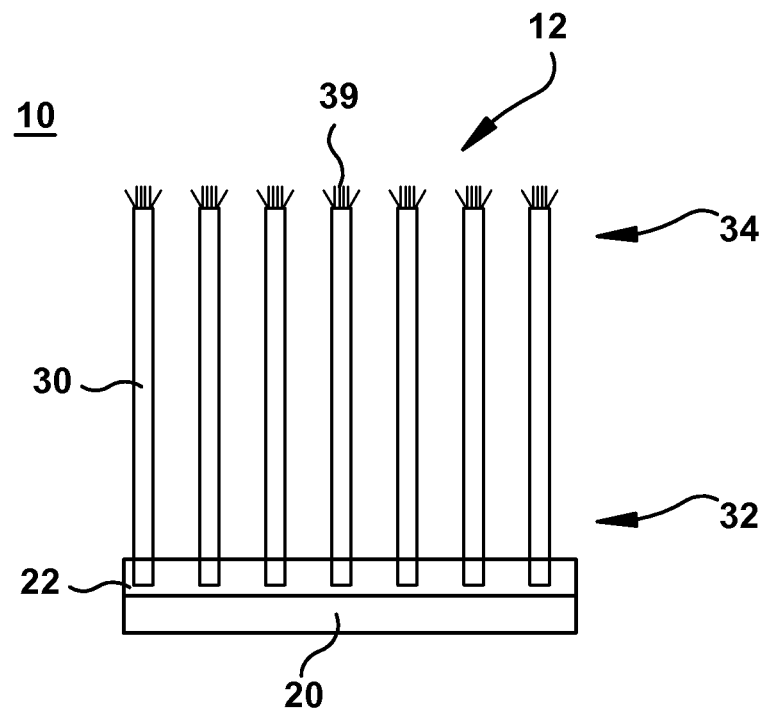
FIG. 1 is a side view of an exemplary construction according to one embodiment of the present disclosure.

For clarity and simplicity, the present specification shall refer to structural and/or functional elements, relevant standards and/or protocols, and other components that are commonly known in the art without further detailed explanation as to their configuration or operation except to the extent they have been modified or altered in accordance with and/or to accommodate the preferred embodiment(s) presented herein.

In general, the present specification discloses various embodiments of a construction with micro- and/or nano-sized structures and/or features supported on and/or attached to an underlying substrate. The present specification also discloses method for fabrication the same. Suitably, the constructions disclosed herein have a functional side or surface, e.g., which is bi-mimetic. Optionally, the structures supported by and/or attached to the underlying substrate are micro- and/or nano-sized fibers or fiber segments. While the constructions and/or methods generally described herein refer to only one functional side or surface, it is to be appreciated that optionally both sides of the construction are and/or can be made functional, e.g., by applying similar fabrication techniques to both sides of the construction. Optionally, each side may be fabricated and/or optimized to have different functional properties, e.g., fiber orientations on either side of the construction may be different.

In particular examples, the construction includes a fiber based dry adhesive functional side or surface, i.e., a gecko-mimetic surface or side. This construction suitable employs structures exhibiting hierarchically organized architectures and/or features, i.e., which branch and/or progressively reduce in size and/or scale (e.g., from micrometer to nanometer size). It has been observed, that adhesion to arbitrary surfaces with very little storage of elastic energy becomes possible when contacting elements are attached to compliant fibers. Furthermore, the total adhesion force is suitably optimized by splitting the contact into many finer contacts, e.g., of similar shape. Contact splitting also ensures defect tolerance and robust adhesion since the failure of a single element or few elements does not impact the adhesion of the ensemble significantly. Robust shape insensitive adhesion is obtainable, e.g., when the diameters of the terminal fibrils are reduced to scales of approximately 100 nm. However, optimal adhesion is still obtainable with specific precisely manufactured shapes when larger sizes of the terminal contact elements are considered. Elastic instabilities leading to challenges posed by fiber clumping or condensation are optionally mitigated by fabricating fibers that are not too long or thin, or by choosing materials that are not too elastically soft.

In alternate examples, other constructions with different functional characteristics are also contemplated. For example, constructions with surfaces or sides which are superhydrophilic, superhydrophobic or water repellant, heat and/or light responsive, drag reducing, etc.

In general, two types of surface structure architectures are disclosed herein: 1) those in which the surface structures form a hierarchical organization of progressively smaller features or dimensions (e.g., from micro-sized to nano-sized), and 2) those in which the surface structures are not split or branched. In the latter case, the structures are suitably formed from segments of single component or multi-component non-splittable fibers, e.g., including hollow fibers, insulating sheath-metal core fibers, etc. which are commercially available.

In particular, constructions with hierarchical branched micro- to nano-scale architecture structures attached to a substrate may be employed to develop, e.g., gecko type adhesive surfaces with superhydrophobic characteristics. As can be appreciated, such surfaces possess much increased surface areas in comparison to flat continuous surfaces. In the case of surfaces containing micro- and/or nano-scale branching structures, the surface area generally increases in dramatic manner. This feature also offers opportunities for generating surfaces that are loaded with catalysts, medications etc. In general, branching fibers and/or fibrils serve as loci for further surface modification either through chemical transformations or attachment of micro- and/or nano-sized particles.

Conversely, surfaces generated using single component and/or non-splittable multi-component fiber segments as the micro- and/or nano-sized structures attached thereto are particularly relevant to obtaining, e.g., stimulus responsive smart surfaces, surfaces with specified friction/drag characteristics, surfaces capable of mechanical interlocking (fasteners), etc. For example, a stimulus responsive surface is one that changes surface texture upon heating or cooling through temperature induced changes of the fiber orientations. Such a trait may be obtained with non-splittable bi-component fibers, where the two components possess different coefficients of thermal expansion and/or contraction. Such surfaces may, e.g., also be used for modifying heat flow characteristics. Other temperature responsive surfaces may be fabricated using fibers composed of shape memory polymers, and may be used as, inter alia, visual temperature indicators.

In accordance with one suitable embodiment, the present disclosed process may optionally be used to generate a soft-touch elastic construction through the direct bonding of fibers to an elastomer substrate. For example, such materials have applications in the clothing and hygiene industry. In any event, various fiber materials may be employed, e.g., including cotton, polypropylene, and surface treated fibers. However, one problem encountered in the direct attachment of fibers to elastomers is that the fibers may tend to de-bond under repeated elongation-contraction cycles of the underlying elastomer. Nevertheless, this problem may be ameliorated by choosing an appropriate substrate-fiber pair.

Figure 2:
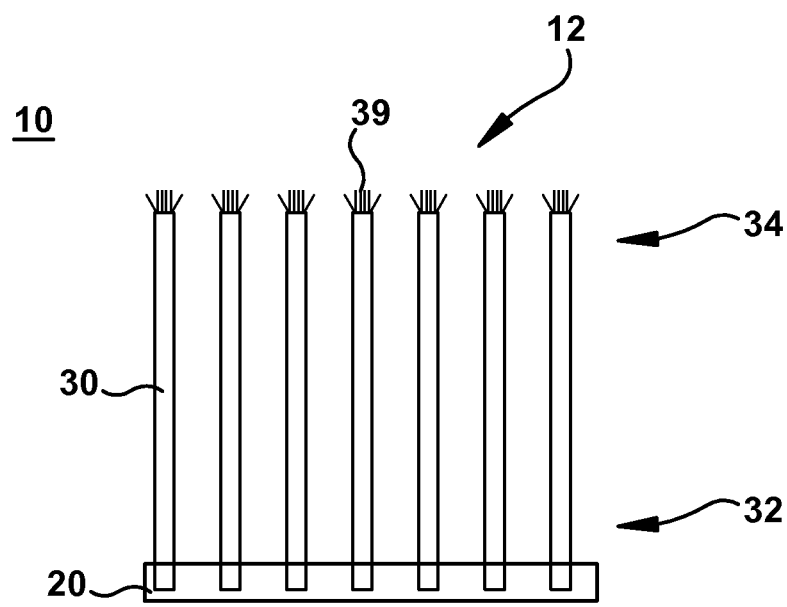
FIG. 2 is a side view of another exemplary construction according to an alternate embodiment of the present disclosure.

With reference now to the FIGURES generally, in suitable embodiments, a construction 10 with a selectively functional surface or side 12 is achieved by adhering, bonding or otherwise connecting one or more structures 30 (e.g., with micro- and/or nano-sized feature) to an underlying and/or supporting surface or substrate (referred to nominally herein as the face stock 20). Suitably, the structures 30 (e.g., the fiber segments as seen in FIG. 1) are bonded to the face stock 20 through the use of an adhesive and/or an adhesive layer 22. Alternately, e.g., as seen in FIG. 2, the structures 30 (e.g., fiber segments) are directly bonded or connected to the face stock 20. In any event, suitably, the proximal ends 32 of the structures 30 are affixed, joined or otherwise connected to the face stock 20, while the distal ends 34 of the structures 30 are not generally so affixed, joined or otherwise connected to the face stock 20.

In general, as used herein, the term proximate shall refer to the portion or end of an element or the like which is connected to and/or otherwise adjacent to the face stock 20. Conversely, the term distal as used herein shall refer to the portion or end of an element or the like which is opposite the proximate portion or end of the same, i.e., the distal portion or end of an element or the like is the portion or end thereof that is remote or spaced apart from the face stock 20.

The FIGURES herein are at times shown at a "microscopic" scale to better illustrate the details of various elements. Accordingly, the functional and/or distal side 12 of the overall construction 10 appears discontinuous in these FIGURES. However, it is to be appreciated that at a "macroscopic" level or scale the density of the structures 30 give the functional side 12 of the construction 10 the appearance of a surface. Accordingly, the term surface may be used at times herein interchangeably with the term side, e.g., as when referring to the functional side of the construction 10 (indicated generally by reference numeral 12).

Additionally, as used herein, the terms micro-sized and nano-sized and the like refer to elements or features having dimensions on the order of micrometers and nanometers, respectively. The terms fibers, tubes, rods and the like are used interchangeably herein and refer to generally elongated elements, features and/or structures, e.g., such as the fiber segments (i.e., structures 30) arranged and/or supported on the face stock 20. In general, the fibers and/or fiber segments referred to herein (e.g., as shown in FIGS. 1 and 2) are suitably cylindrical, but depending on the application, they may alternately have cross-section areas or shapes other than circular. The fibers and/or fiber segments referred to herein generally may be hollow or solid as appropriate for various applications. A plurality of fibers or fiber segments bundled together is at times referred to herein as yarn, and where appropriate, when referring herein to a single fiber, tube, rod or the like or segment thereof, it is to be appreciated that a yarn may be similarly employed. Suitably, the fibers and/or fiber segments referred to herein are synthetic or man-made structures, or alternately depending on the application, the fibers and/or fiber segments may be made from natural materials (e.g., cotton). Some fiber materials that are optionally employed in accordance with the present disclosure include, but are not limited to: cotton, rayon, acrylic, nylon, polyester, polypropylene, carbon, Teflon® and Kevlar®. For selected applications, the fibers and/or segments thereof may be single component elements, bi-component elements or other multi-component elements. Where bi- and/or multi-component fibers and/or segments are used, they may be either splittable or non-splittable as appropriate for a given application. As used herein, the terms bi-component or multi-component or the like refer to fibers or elements which are made or constructed from two or more different materials (i.e., two or more materials with different physical or other properties) as the case may be.

Figure 3:
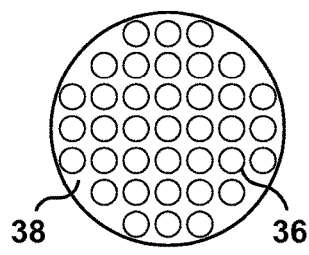
FIG. 3 is an end view of an exemplary island-in-the-sea (INS) type fiber or fiber segment used to create micro- and/or nano-sized structures on an exemplary construction according to various embodiments of the present disclosure.
Figure 4:
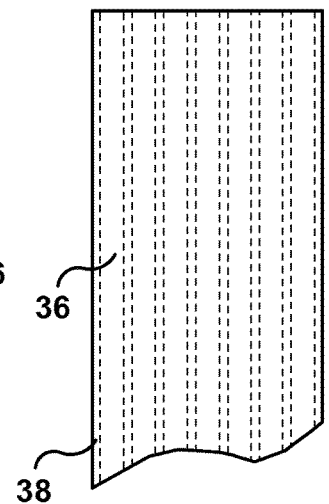
FIG. 4 is a partial side view of the INS type fiber or fiber segment shown in FIG. 3.
Figure 5:
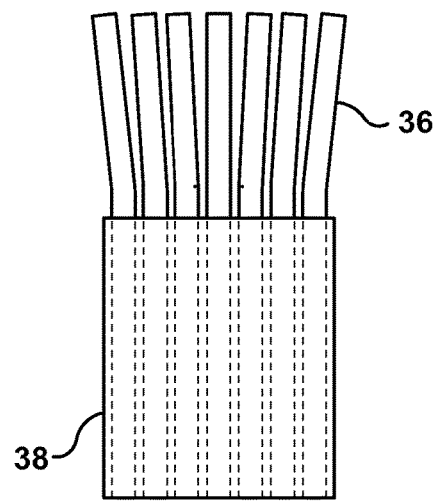
FIG. 5 shows the same view as FIG. 4 with a portion of the sea material removed from the distal end thereof.

One type of bi- and/or multi-component fiber contemplated for use in connection with selected embodiments described herein is generally known as an island-in-the-sea (INS) type material or fiber. An example of a suitable INS material or fiber is illustrated in FIGS. 3-5. As shown, the so called "islands" are micro- and/or nano-fibers 36 made of a first polymer or other suitable material. The so called "sea" is a matrix 38 made of a second polymer or other suitable material (e.g., different in composition and/or properties from the first material that the fibers 36 are made of). The sea in essence holds the islands together such that the longitudinal axes of the fibers 36 are substantially parallel to one another.

Figure 6:
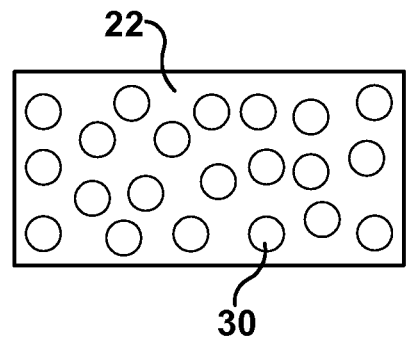
FIG. 6 is a top view of the embodiment shown in FIG. 1 with an exemplary random distribution of fiber segments and/or structures on the face stock.
Figure 7:
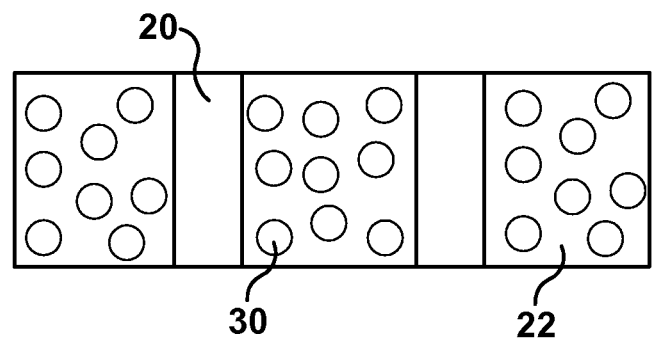
FIG. 7 is a top view of the embodiment shown in FIG. 1 with an exemplary patterned distribution of fiber segments and/or structures on the face stock.
Figure 8:
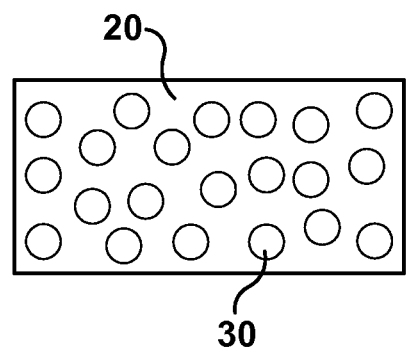
FIG. 8 is a top view of the embodiment shown in FIG. 2 with an exemplary random distribution of fiber segments and/or structures on the face stock.
Figure 9:
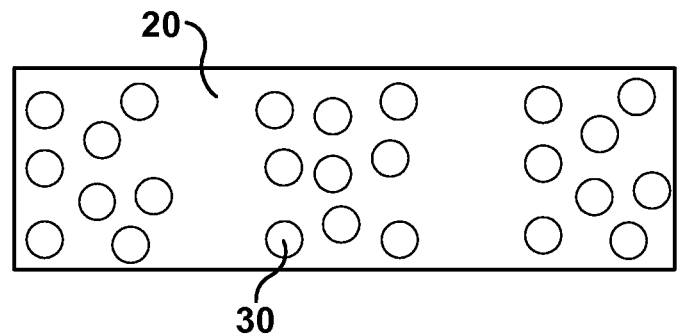
FIG. 9 is a top view of the embodiment shown in FIG. 2 with an exemplary patterned distribution of fiber segments and/or structures on the face stock.

Referring again to FIGS. 1 and 2, for either case, the distribution or arrangement of the structures 30 on the face stock 20 is optionally random or patterned. For example, FIG. 6 illustrates a top view of the embodiment shown in FIG. 1 wherein the structures 30 are bonded to the face stock 20 through an adhesive 22 and the structure distribution is random, while FIG. 7 illustrates a top view of the embodiment shown in FIG. 1 wherein the structures 30 are bonded to the face stock 20 through an adhesive 22 and the structure distribution is arranged in an exemplary pattern. Similarly, FIGS. 8 and 9 illustrate alternate top views (i.e., in accordance a random structure distribution and an exemplary patterned structure distribution, respectively) of the embodiment shown in FIG. 2 (i.e., where the structures 30 are directly bonded or otherwise connected to the face stock 20). Although the above embodiments are shown with the fiber segments (i.e., structures 30) oriented at right angles or substantially normal to the face stock 20, it is to be understood that the fiber segment orientation may optionally be controlled or altered to form a specific desired angle (i.e., which is other than a 90° angle or substantially normal) with respect to the face stock 20, e.g., either before or after curing the adhesive 22 or face stock 20.

In practice, the surface characteristics and/or functionality of the construction 10 can be finely tuned to achieve a desired functionality of the surface 12 through an appropriate choice of: the structures 30 supported on the face stock 20, the pattern and/or arrangement of the structures 30, the micro- and/or nano-sized features of the structures 30, the materials and/or dimensions for any of the aforementioned, etc. For instance, the fiber segments (i.e., structures 30) or other micro-/nano-sized features thereon or other like particles or structures (or particular components thereof) are optionally chosen to have specific physical and/or other properties (e.g., such as lengths or dimensions, selected electrical, magnetic and/or electromagnetic characteristics, stiffness characteristics, temperature response, etc.), where the value of one or more or the variables is, e.g., independently selected to achieve the desired surface functionality (i.e., the functionality of the surface 12 of the overall construction 10). Optionally, the surface 12 can also be printed and embossed as desired particular applications. Practical applications for various exemplary constructions contemplated herein are many, and a few such contemplated uses for the constructions prepared in accordance with the present disclosure are listed in Table I below. However, other contemplated uses include, without limitation: repositionable adhesive constructions, wound care dressings, thermally conductive films, and optoelectronic devices.

TABLE 1

| Industry | Applications |
| --- | --- |
| Technical parts | Filtering cloths, filtering cartridges, friction elements, brushing cylinders for photocopiers, polishing pads |
| Automobiles and vehicles | Dashboard paneling, window guiding profiles, head linings, floor mats, artificial leather upholstery, flocked noise reduction strips |
| Construction | Wall and ceiling paneling for decoration and sound insulation, ceiling elements to absorb condensation water |
| Paper industry | Velour wall paper, reinforced paper, labels, decoration paper, cardboard, gift wrapping paper, stationary |
| Textile industry | Floor coverings, friction belts, upholstery material, foam bed covers, technical gauzes |
| Medicine/ hygiene | Lens polishing cloths, cosmetic pads |

Notwithstanding the foregoing variety of applications, in one suitable embodiment, the construction 10 acts as an adhesive construction and a method for producing the same is disclosed herein. For example, a desired hierarchically organized adhesive construction such as the construction 10 (e.g., with a bio- or gecko-mimetic surface 12 or dry adhesive structure) is generated or produced by a two step processes including:

1) attaching structures 30 (e.g., such as the fiber segments illustrated in FIGS. 1 and 2) to the face stock 20 (e.g., via one or more methods, processes and/or means described later herein); and 2) forming micro- and/or nono-sized features (e.g., such as the fibrils 39 illustrated in FIGS. 1 and 2) at or on the distal ends 34 of the structures 30 (e.g., again via one or more methods, processes and/or means described later herein).

Suitably, the resulting construction 10 conforms, e.g., to the embodiments discussed with reference to FIGS. 1 and 2 above. As used herein, the term fibril generally refers to a micro- and/or nano-sized fiber or a micro- and/or nano-sized portion or part thereof as the case may be.

Suitably, before the construction 10 is made, the structures 30 (e.g., fiber in this case) are produced. For example, the fabrication of fibers or yarn suitable for use as the structures 30 is accomplished through well-known means such as chemical synthesis, template assisted synthesis, chemical vapor deposition, electro-spun fibers, or spun or melt blown fibers, etc. That is to say, any one or more of the aforementioned or other suitable techniques are optionally employed to produce single fibers or bundles of fibers or yarn. In turn, segments of the forgoing are used as the structures 30.

In one suitable embodiment, the aforementioned step (1) (generally referred to herein as the attaching step or process) is achieved by a flocking process that deposits a plurality of separate structures 30 (i.e., fiber segments) onto the face stock 20. This method shall generally be referred to herein as the flocking method. Alternately, the attaching step or process is achieved by bundling a plurality of fibers together with a common axial orientation, cutting or otherwise taking a cross-section from the bundle to form a disk or wafer (which now includes a plurality of fiber segments that in turn become the structures 30) and then placing the disk/wafer on the face stock 20. This method is generally referred to herein as the bundling method.

In either case, where an embodiment such as that illustrated in FIG. 1 is being produced, the face stock 20 is optionally coated with the adhesive layer 22 prior to placement of the structures 30 on the face stock 20. Following placement of the structures 30 on the adhesive coated size of the face stock 20, the adhesive 22 is optionally cured, e.g., via heat and/or radiation, to firmly secure the structures 30 to the face stock 20. Optionally, curing of the adhesive 22 is executed after selectively orienting the structures 30 at a desired angle with respect to the face stock 20.

Alternately, where an embodiment such as that illustrated in FIG. 2 is being produced, the face stock 20 may be made from an uncured material coated on a carrier film or the like bearing a suitable release layer or agent (e.g., fluorosilicone, fluorocarbon, silicone, etc.) on the coating side surface of the carrier film. Suitably, the face stock material is optionally a heat and/or radiation curable material, e.g., such as RTV (Room Temperature Vulcanizing) silicones. The structures 30 in this case are optionally placed directly on the uncured (incipient) face stock material. Following placement of the structures 30, the face stock material is optionally cured, e.g., via heat and/or radiation, to solidify the face stock 20 and firmly secure the structures 30 thereto. Optionally, curing of the face stock 20 in this case is executed after selectively orienting the structures 30 at a desired angle with respect to the face stock 20.

In yet another alternative, where an embodiment such as that illustrated in FIG. 2 is being produced, the face stock 20 may be made from a molten thermoplastic film or other like material. The structures 30 in this case are optionally placed directly on the face stock 20 while at least partially molten, e.g., on freshly extruded film that has not yet cooled and/or solidified. Optionally, the molten state may be achieved by simply heating the face stock 20 past its melting temperature. Alternately, a molten layer is obtained by infusing the face stock 20 with a dye that reacts, e.g., to infrared (IR) radiation, and then irradiating the face stock 20 with said radiation. In any event, following placement of the structures 30 on the at least partially molten face stock 20, the face stock material is cooled to solidify the face stock 20 and firmly secure the structures 30 thereto. Again, optionally selective orientation of the structures 30 at a desired angle with respect to the face stock 20 is performed prior to cooling the same.

In still another alternative, where an embodiment such as that illustrated in FIG. 2 is being produced, the structures 30 may optionally be placed or deposited on a layer of solvent dissolved resin which is part of or which is to become the face stock 20. When the solvent is evaporated or otherwise removed and/or the layer and/or face stock 20 solidifies, the structures 30 thereby become embedded in and/or otherwise bonded directly to the face stock 20. Again, optionally selective orientation of the structures 30 at a desired angle with respect to the face stock 20 is performed prior to evaporating or otherwise removing the solvent.

Figure 10:
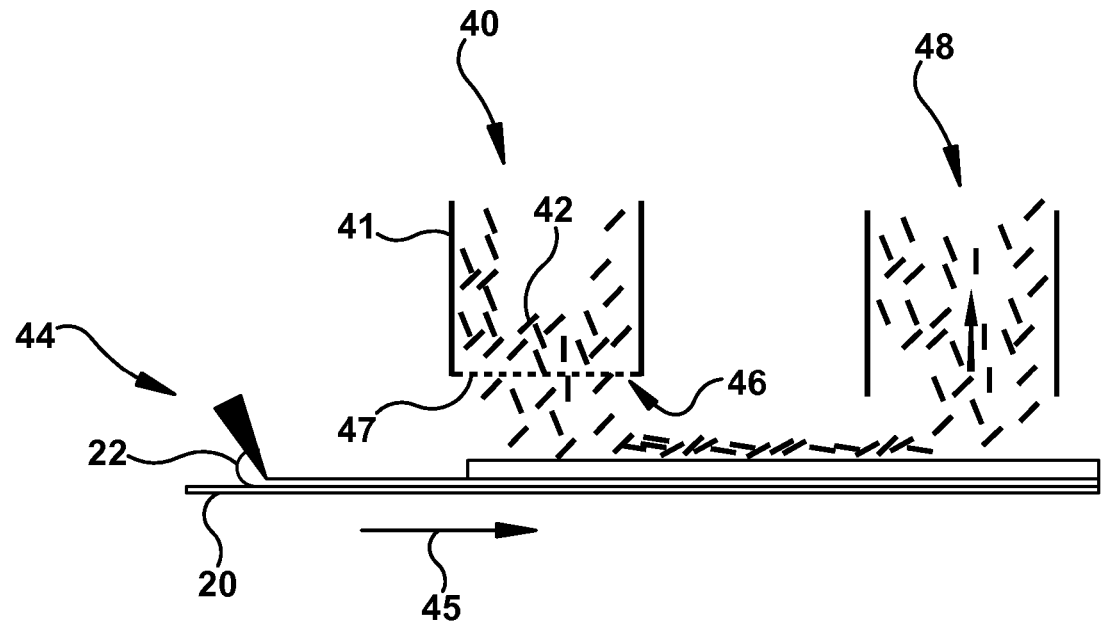
FIG. 10 is a schematic illustration showing an exemplary flocking process used for depositing structures on a substrate or face stock in accordance with one embodiment of the present disclosure.

With reference now to FIG. 10, an exemplary flocking method is illustrated for placement or depositing of the structures 30 on the surface of the face stock 20 (be it coated with the adhesive layer 22 or not). As shown, a flocking station 40 includes a hopper 41 into which a flock material 42 is loaded. For example, the flock material 42 in this case is a plurality of fiber segments which are to become the structures 30. More specifically, each segment may optionally be a segment of an INS type fiber.

In any event, a web of the substrate or face stock 20 (optionally coated with an adhesive layer 22 at a coating station 44) is moved and/or passed (e.g., in the direction indicated by the arrow 45) by the mouth 46 of the hopper 41. Suitably, the mouth 46 of the hopper 41 is fitted with a screen or sieve 47 through which the flock material 42 falls, passes or otherwise advances toward the web. Optionally, an excess flock removal station 48 down the line reclaims flock material 42 (e.g., via suction) which does not become secured to the face stock 20.

In one suitable embodiment, optionally electrostatic flocking is performed. Accordingly, an electrical field is created at or about the region where the flocking is executed. For example, the web may optionally pass through a positively charged electrode and a grounded electrode which generate the aforementioned electrical field at or near the location where the flocking is being executed. The electrical field aids in achieving a desired orientation of the flocked material 42 (i.e., fiber segments in this case). That is to say, the electrical field applies a force or forces to the fiber segments (i.e., which ultimately become the structures 30) as they are falling on or otherwise approaching the web (i.e., face stock 20). These forces tend to align the flocked material 42 (i.e., fiber segments) with a desired angle relative to the surface of the face stock 20. That is to say, the electrical field urges the fiber segments toward an orientation in which the longitudinal axes thereof form a desired angle with respect to the surface of the face stock 20. Of course, by controlling the direction of the electrical field and/or otherwise manipulating the created electrical field, the desired angle is able to be selectively controlled or regulated.

Of course, to be processed with an electrostatic flocking method as described herein, the fiber segments or other flocking material 42 are selected or otherwise made to be at least partially electrically conductive. For example, suitably the fiber segments have sufficient electrical conductivity such that they may be orientated with respect to the surface of the substrate or face stock 20 by the generated electrical field. Optionally, the fiber segments may be either inherently conductive (i.e., embed with and/or otherwise including metallic and/or other electrically conductive materials, e.g., upon fabrication of the fibers) or they may be made conductive, e.g., as a result of being treated so as to become at least partially electrically conductive.

In essence, electrostatic flocking involves the use of a pair of electrodes maintained a relatively large potential difference with respect to one another. For example, a ground potential is optionally maintained at the substrate or face stock 20 and/or via grounded parts of the apparatus carrying the same. Accordingly, the other electrode is implemented as a grid to charge the flocked material 42. The fiber segments in this case subsequently become aligned along the electric field lines of force and are propelled towards the substrate or face stock 20 were they become embedded (e.g., either in the adhesive 22, if present, or directly in the surface of the face stock 20, as the case may be). Significantly, electrostatic flocking allows anisotropically shaped particles and/or high-aspect ratio particles (e.g., such as fiber segments) to be implanted with a high degree of orientational order with respect to the surface of the substrate or face stock 20.

Electrostatic flocking of such fiber segments as disclosed herein may optionally includes both DC (direct current) and AC (alternating current) flocking methods. In any event, the fiber packing density obtained through electrostatic flocking depends on numerous factors including the fiber diameter and the electric field strength. Monte Carlo calculations based on the assumptions of random vertical impingement of fibers have shown that the fraction of substrate area (f) that can be covered is constant and equal to 0.531 irrespective of the fiber diameters. That is, 53.1% of the available area on the substrate can be covered through electrostatic flocking with vertically oriented fibers. The fiber packing density (n) is related to f as $n=(4f/\pi d^2)$, where d is the cross section diameter of the fibers. However, it has been found that packing densities obtained through experiments are generally lower than the calculated values. For instance, densities of 200 fibers/mm$^2$ have been experimentally obtained for fibers with diameters of 20 μm and lengths of 500 μm, whereas the Monte Carlo model predicts a density of $1.7 \times 10^3$ fibers/mm$^2$. Reasons for the disparity include non-vertical impingement of fibers, bent fibers, Coulombic repulsion of adjacent fibers and insufficient number of fibers applied during the process. However, the flock fiber packing densities can be increased through the use of guiding electrodes and/or a shrinkable face stock 20.

In another suitable embodiment, optionally mechanical flocking is performed. In accordance with an exemplary mechanical flocking process, the web of face stock 20 is passed over one or more beater bars (e.g., such as polygonal rollers that rapidly rotate) to vibrate the web or face stock 20 in or near the area where the flocking is being executed. The vibrations created by the mechanical flocking help drive the flocked material 42 into the adhesive 22 or directly into the surface of the (e.g., molten or uncured) face stock 20 as the case may be.

In yet another example, pneumatic flocking may optionally be employed. Pneumatic flocking employs an air stream to deliver the flocked material 42 to the face stock 20. Using the method, flocked material 42 caught in the air stream is delivered to the face stock 20. This allows a face stock 20 which may in some applications have a complex three-dimensional shape to be evenly covered with the flocked material 42.

In suitable embodiments, any combination of one or more of the foregoing flocking techniques may be employed to deposit the flocked material 42 on the face stock 20 (be it coated with adhesive 22 or not). Of course, depending on the techniques employed, the flock material 42 may optionally be gravity fed toward the face stock 20 or alternately the air flow and/or electrical field may allow for feeding the flock material 42 in other directions (e.g., upward, horizontally, etc.). Of course, each flocking techniques has certain benefits, e.g., electrostatic flocking allows good orientation control, while mechanical flocking achieves good bonding of the flocked material 42 to the face stock 20. In particular, it has been observed that the combination of electrostatic and mechanical flocking achieves good quality bonding and good structure (i.e., fiber) density.

Moreover, while flocking and/or orientation processes are described herein with reference to the use of an applied electric field, it is to be appreciated that similarly an applied magnetic field or electromagnetic field may likewise be used in place of or in addition to the described electric field for either or both flocking and/or orientation purposes. Of course, the fiber segments or other structures in that case have electrical, magnetic and/or electromagnetic properties which make them suitably responsive to the type of field employed.

Figure 11:
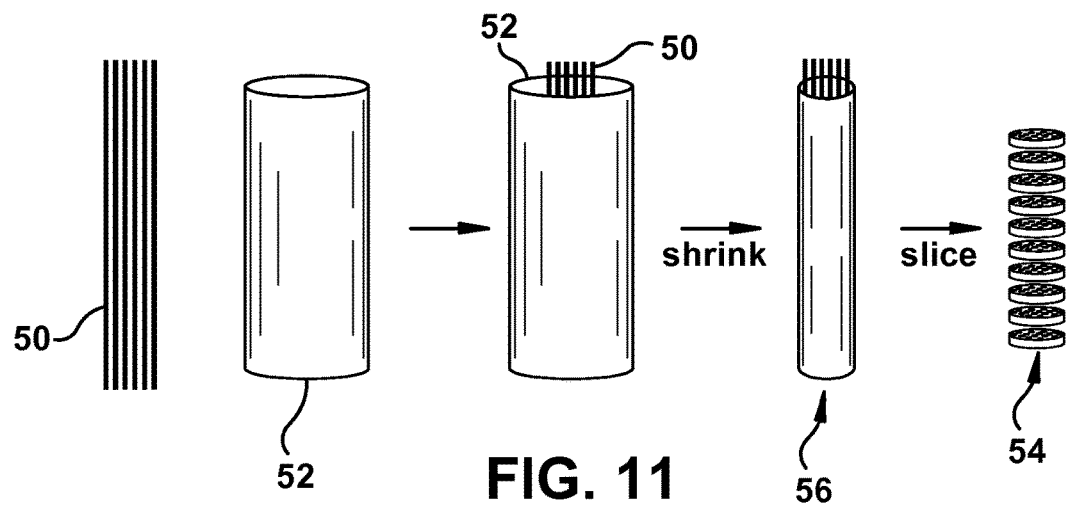
FIG. 11 is a schematic illustration showing an exemplary fiber bundling and slicing process used for placing structures on a substrate or face stock in accordance with another alternate embodiment of the present disclosure.

As mentioned above, another optional method for attachment of the structures 30 to the face stock 20 involves the so called bundle method. With reference now to FIG. 11, a suitable example of the bundle method is illustrated.

As shown in FIG. 11, a plurality of fibers 50 are collected together so that their longitudinal axes are generally aligned in a common direction. For example, each fiber 50 may be an INS type fiber. The fibers 50 are then placed in a heat or otherwise shrinkable tube 52, and the tube 52 is shrunk to hold the fibers 50 together in a bundle. Optionally, a binder may also be used to help hold the bundle of fibers 50 together, e.g., while they are placed or otherwise arranged in the tube 52. In any event, upon shrinking the tube 52 the fibers 50 are compactly held together in a common axial alignment. Alternately, instead of using a shrinkable tube, the fibers 50 are simply tightly packed in to a tube of relatively fix diameter or size.

Thereafter, one or more cross-sectional disks or other cross-sectional shaped wafers 54 are taken from the bundle 56 (i.e., the fiber and tube combination). For example, the cross-sectional wafers 54 are optionally sliced, cut or otherwise obtained from the bundle 56. As can be appreciated, each wafer 54 now includes an outer ring (i.e., formed from the corresponding section of the tube 52) that contains a plurality of segments of the fibers 50 each still having a substantially common axial alignment.

Figure 12:
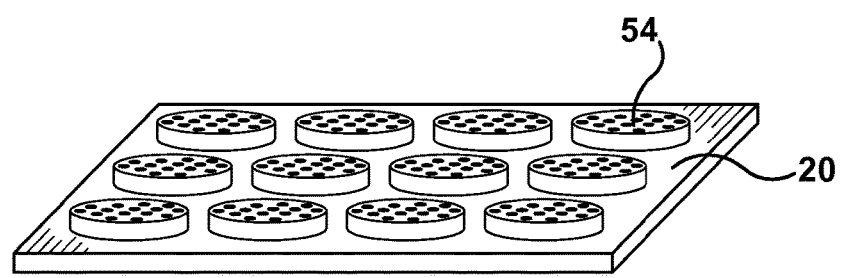
FIG. 12 shows wafers created in accordance with the process shown in FIG. 11 being placed on the substrate or face stock.

As shown in FIG. 12, once removed from the bundle 56, one or more of the wafers 54 are placed on the surface of the face stock 20 (be coated with an adhesive layer 22 or not). Upon removal of the outer ring from the wafer 54 and optionally any binder material that may have been used, the now separated individual fiber segments remaining secured to the face stock 20 are free to serve as the structures 30.

Alternately, wafers 54 of sufficient size may be employed as the entire construction. That is to say, the substrate or face stock 20 may optionally be omitted when the wafers 54 are sufficiently self supporting.

Figure 13:
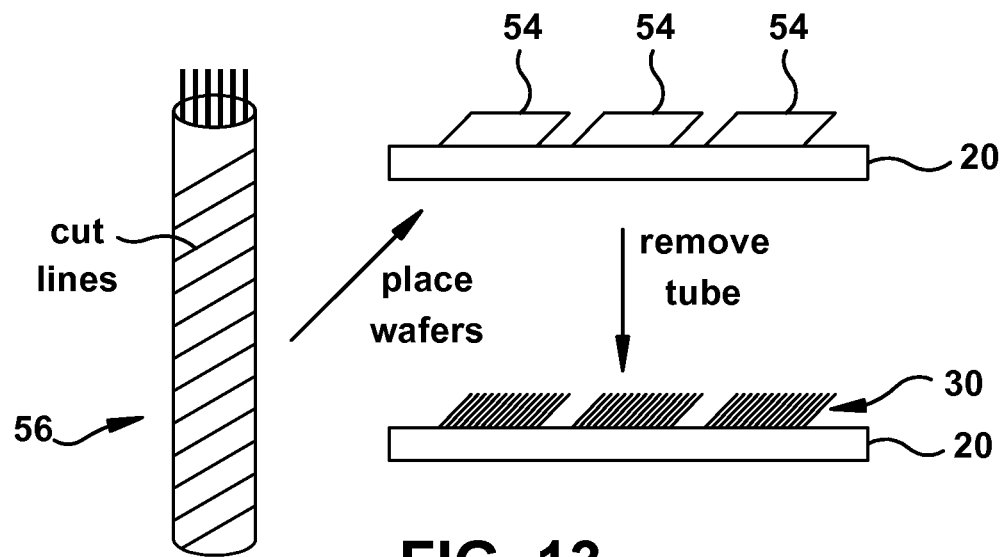
FIG. 13 illustrates an exemplary process in accordance with the embodiment shown in FIG. 11, wherein the slicing is executed an angle to achieve a desired orientation of the fiber segments that make up the structure attached to the face stock.

With reference now to FIG. 13, the cross-sectional wafers 54 are optionally sliced, cut and/or otherwise taken from the bundle 56 at an angle with respect to the common axial alignment of the fibers 50 such that when the wafers 54 are placed on the surface of the substrate or face stock 20 the longitudinal axes of the fiber segments (i.e., the structures 30) obtained from the wafers 54 form a desired angle with respect to the surface of the substrate or face stock 20. In this manner, a desired orientation of the fiber segments is achievable via the bundle method for attaching the structures 30 (i.e., the fiber segments in this case).

In any event, e.g., where the flocking method or bundling method is used to execute the attachment process, orientation of the fiber segments or structures 30, is optionally completed before the bonding of the fiber segments or structures 30 is set, i.e., before the curing or setting of any adhesive 22 that is optionally used or before the curing or setting of the face stock 20 (e.g., if an embodiment such as depicted in FIG. 2 is being fabricated). That is to say, suitably once the bonding is set, the general orientation of the fiber segments or structures 30 with respect to the surface of the face stock 20 is relatively fixed. As used in this context, the term orientation generally refers to the angle that the longitudinal axes of the fiber segments form with or relative to the surface of the face stock 20. In one suitable embodiment, the desired angle of orientation is in the range of between approximately 15° to approximately 75°. In another suitable embodiment, the angle of orientation is approximately 90°.

Suitably, the desired orientation is optionally achieved when the fiber segments and/or structures 30 are placed or deposited on the face stock 20, e.g., as described above with respect to both the flocking and bundling methods. Alternately, the desired orientation is achieved in separate step. In any event, the orientating of the fibers segments and/or structures 30 may optionally be achieved via application of a structure/fiber orienting electric field, air jets blowing the structures/fibers into a desired orientation, mechanical combing or other like physical manipulation of the structures/fibers into a desired orientation, etc.

Optionally, the orientation of the fiber segments or structures 30 may be altered or changed or otherwise controlled after the bonding is complete, i.e., after the curing or setting of any adhesive 22 that is optionally used or after the curing or setting of the face stock 20 (e.g., if an embodiment such as depicted in FIG. 2 is being fabricated). Suitably, this is accomplished by bending or otherwise re-orienting the fiber segments or structures 30 to the desired angle. In one example, the fiber segments and/or structures 30 are heated (so as to become suitably pliable) and the heated fiber segments and/or structures 30 are bent to the desired orientation. Suitably, when cooled, the fiber segments and/or structures 30 will retain their altered orientation. For example, the aforementioned may optionally be accomplished by running a heated blade or other like tool or instrument over the surface 12 of the construction 10 to bend the fiber segments and/or structures to a desired orientation.

One potential problem that may be encountered, e.g., with gecko-mimetic constructions such as those disclosed herein, is reduced adhesion resulting from a lack of contact of significant numbers of micro- and/or nano-fibers with the surface to which adhesion is sought. Notably, such a situation is found in geckos, where it is experimentally found that only approximately 3% of the setae participate in adhesion. Nonetheless, large adhesion forces, e.g., of approximately 8 N, are generated by the contacting setae-nano-fiber system, and these forces can support several times the body weight of the animals. Generally, the reduced contact and adhesion is attributed to setae that are improperly oriented and to the varied distribution of setae lengths. In the case of synthetic construction of the type described herein, it is also possible that not all of the micro- and/or nano-fibers will contribute to adhesion. However, adhesion reduction in this case can be significantly mitigated by consistent fiber orientation and length. For example, significant adhesion reductions are not as likely to occur where precision cut fibers are flocked and/or oriented under a strong homogeneous field, whereas reductions may occur when random cut fibers are flocked and/or oriented under a weak field. As an additional measure to ensure uniform fiber length, optionally the fibers and/or fibrils may be shaved, trimmed or otherwise cut to uniform lengths, e.g., after attachment to the face stock 20.

Forming the micro- and/or nano-sized features (e.g., such as the fibrils 39 shown in FIGS. 1 and 2) on the structures 30, is suitably accomplished via splitting and/or other suitable fibrillation of the distal ends 34 of the fiber segments and/or structures 30. However, there are numerous ways in which this fibrillation is optionally executed and/or in which the micro- and/or nano-sized features are formed. Some examples of suitable method are described below.

Several types of suitable fibers capable of being split or fibrillated are commercially available, and are typically composed of two or more weakly bonding, phase separating, component materials wherein the different phase domains can be split or fibrillated to yield micro-scale and/or nano-scale fibrils. For example, the splitting or fibrillation is optionally accomplished either through mechanical means or by dissolving away one of the components. One specific class of fibers, capable of being split or fibrillated are INS type fibers, where the sea polymer or material 38 can be, e.g., at least partially dissolved with water and/or another suitable dissolver to release and/or reveal at least a portion of the micrometer sized and/or nanometer sized island fibers 36. Suitably, the released and/or revealed portion is at the distal ends 34 of the main fiber segments and/or structures 30, thereby forming the micro- and/or nano-sized features or fibrils 39, e.g., as illustrated in FIGS. 1 and 2. Other methods that are optionally used to remove at least at portion of the sea polymer or material 38 from the distal ends of the main fiber segments or structures 30 induce shrinkage of the sea polymer or material 38, thereby retracting and/or withdrawing the same from the distal ends 34 of the main fiber segments and/or structures 30. In yet another embodiment, the micro- and/or nano-sized features (e.g., such as the fibril 39) are grown from exposed ends of the island material or fibers 36 that act as nucleating sites for the growth.

For example, the splitting or fibrillation to engender nano-scale fibrils 39 is optionally conducted after depositing or placement and either after or concomitantly with adhesive or face stock bonding of the micro-meter scale main fiber segments (i.e., structures 30). Approaches for splitting or fibrillating the main fiber segments or structures 30 include, but are not limited to: 1) partial rinse off of the sea polymer or material 38 from the distal ends 34 of INS type fiber segments, 2) heat induced contraction of the sea polymer or material 34 which retracts the same from the distal ends of the fiber segments or structures 30, 3) electron beam curing induced contraction of the sea polymer or material 34 which retracts the same from the distal ends of the fiber segments or structures 30, 4) mechanical stress induced splitting of the distal ends 34 or tips of the fiber segments or structures 30, and 5) growing the fibrils 39 from the exposed tips or distal ends of the island material 36.

An optional first approach to splitting or fibrillation of INS or like multi-component type fiber segments entails a partial rinse off of the sea material 38 with hot water or another appropriate solvent to expose a portion of the island nano-fibers 36 (i.e., the fibrils 39 illustrated in FIGS. 1 and 2). Suitably, the rinsing step is conducted after bonding the main fiber segments and/or structures 30 to the face stock 20. One potential problem that may be encountered with this approach is that the main fiber segments (i.e., structures 30) and/or the fibrils 39 may stick together upon exposure to the water or solvent. However, this may be mitigated by conducting the rinsing and drying steps concomitantly with sonication so that the continuous mechanical agitation protects against the main fibers and/or fibrils from sticking or bonding to one another. Alternatively, the main fibers and/or fibrils may be subjected to mechanical agitation following rinsing and during the drying step, to generate stresses sufficient to cause the main fibers and/or fibrils to de-bond and/or un-stick from each other. Suitably, nano-fibers or fibrils 39 of various lengths may be generated by varying the rinse times.

An optional second approach to splitting or fibrillation of INS or like multi-component type fiber segments entails heat induced contraction of the sea material 38 to expose a portion of the island nano-fibers 36 (i.e., the fibrils 39 illustrated in FIGS. 1 and 2). This approach is suitably practiced with INS fiber segments where the sea material 38, e.g., consists of a heat shrinkable thermoplastic polymer such as polypropylene (PP) or polyethylene (PE). Optionally, the splitting step may be conducted concomitantly with the bonding of the main fiber (i.e., structure 30) to the face stock 20. The mechanism of shrinking in the case of thermoplastics is optionally as follows. The material is suitably subjected to longitudinal (i.e., along the major axis of the INS fiber segment) stress at elevated temperatures. Suitably, the strain that is generated is locked in by rapidly cooling the material while it is under stress. Stress relaxation then occur upon reheating the material, which causes the material dimensions to shift back towards the original values. In the case where the sea polymer or material 38 consists of a thermoplastic material, sufficient strain may be generated and locked in during the INS fiber fabrication process. In this event, reheating (e.g., during the step of bonding the main fiber segments (i.e., the structures 30) to the face stock 20) will cause a retraction of the sea material 38 to expose a portion of the nano-fibers 36 (i.e., the fibrils 39 illustrated ion FIGS. 1 and 2). Optionally, if the extent of sea material retraction is insufficient, then deliberately strained fibers may be employed. The heat shrink characteristics of the sea polymer or material 38 may optionally be improved through electron beam crosslinking prior to introduction of the strain. Optionally, fibrils 39 of different lengths may be generated by varying the strain introduced in the fibers and by varying the sea thermoplastic polymer.

An optional third approach to splitting or fibrillation INS or like multi-component type fiber segments entails electron beam curing induced contraction of the sea polymer or material 38 to expose a portion of the island nano-fibers 36 (i.e., the fibrils 39 in FIGS. 1 and 2). This approach is optionally practiced with INS fiber segments where the sea polymer 38 consists of a partially polymerized material or a crosslinkable material. Again, the splitting step may optionally be conducted after bonding the main fiber segments (i.e., structures 30) to the face stock 20. Suitably, this approach includes crosslinking of sea polymers or material 38 that contain a substantial degree of unsaturation. For example, the mechanism of electron beam curing induced polymer shrinking is as follows. In particular, free radicals and charges are created in the sea material 38 when it is exposed to high energy electrons. These reactive species engender polymerization and/or crosslinking due to which the density of the sea material 38 increases. The density increase results in a decrease of the volume—that is, the sea material 38 shrinks. Again, nano-fibers or fibrils 39 of different lengths may be generated by varying the extent of crosslinking or polymerization of the sea material 38. A variety of different electron beam curable resin compositions may be employed for the sea material 38 in accordance with this approach.

An optional fourth approach to splitting or fibrillation entails subjecting INS or like multi-component type fibers to mechanical stresses to cause de-bonding of the island nano-fibers 36 from the sea polymer or material 38. Suitably, the splitting step may optionally be conducted after bonding of the main fiber segments and/or structure 30 to the face stock 20. In this approach, the island and sea polymers or materials (i.e., 36 and 38, respectively) are suitably selected to be mutually incompatible and thus it is possible to fragment the tips or distal ends 34 of the main fiber segments and/or structures 30 by subjecting them to sufficiently intense mechanical stresses. For example, in one suitable embodiment this is accomplished by run an electric razor or other like stress inducing tool or instrument over the functional side 12 of the construction 10.

An optional fifth approach to forming the micro- and/or nano-sized features again uses segments of INS type or other like multi-component fibers as the structures 30, and it is again optionally conducted after attaching or bonding the main fiber segments and/or structures 30 to the face stock 20. In this embodiment, the exposed ends of the island material 36 optionally act as nucleating sites or the like from which micro- and/or nano-sized features are grown, e.g., such as the fibrils 39. For example, in this process, the surface 12 is discontinuously coated with materials from which micro- and/or nano-sized features are subsequently grown. Such materials could be free radical or ultraviolet (UV) light activated polymerization initiators, or metal nano-particles that function as polymerization catalysts. In this embodiment, the initiator or metal nano-particle coated fibers are optionally coated or dipped into a monomer solution and then polymerization to grow nano-fibers or brushes initiated via heat and/or suitable radiation exposure.

Yet another optional approach to achieve the desired fibrillation involves applying a mechanical or other like stress to the INS type fibers. For example, the distal ends of the main fibers may optionally be press or squeezed, thereby de-bond the island material 36 from the sea material 38.

In general, if the fibrillation is executed after the main fiber segments or structures 30 are attached to the face stock 20, it is sufficient to fibrillate only the distal ends 34 thereof. However, fibrillation may alternately be executed prior to the structure attachment process, in particular, when the flocking method is employed. In this case, it is optional that both ends of the fiber segments (i.e., the flock material 42) are fibrillated. Accordingly, regardless of which end ultimately attaches to the face stock 20, the other end (i.e., which turns out to be the distal end 34) will in fact be fibrillated. That is to say, during the flocking process it is difficult ensure that any given end is in fact the end that attaches to the face stock 20. Accordingly, by fibrillating both ends of the flock material 42, it does not matter which end ultimately becomes the attachment or proximal end 32, insomuch as the other end will also be fibrillated.

With and/or without the adhesive layer 22, the face stock 20 component represents the foundation of the construction 10 disclosed herein. Suitably, the face stock 20 can be made from films of common plastic face stock material, e.g., such as polyester, PP or PET (polyethylene terephthalate). Suitably, the construction 10 is able to deform and conform to surface roughness features on length scales of approximately 1 to approximately 1000 µm. Notably, in the case of geckos, the skin of the toe pads consists of an approximately 100 µm thick β-keratin layer. β-keratin is a hydrophobic protein that is characterized by a bulk modulus of approximately $2\times10^9$ Pa. To mimic this, films composed of, e.g., polyester or PP, may be used to form the flexible face stock 20 disclosed herein. These materials exhibit bulk moduli that lie in a range of approximately 1 to approximately $5\times10^9$ Pa, as do many other common polymers. When used, the choice of adhesive 22 to bond the structures 30 to the face stock 20 is suitably dictated, e.g., by the chemical nature of the sea polymer constituent 38 of the bi-component fibers and that of the face stock 20. For instance, epoxy adhesives may be used in the case where the sea polymer or material 38 is made of polyvinyl alcohol and the face stock 20 is made of polyester. In any event, the conformability of the overall construction 10 will generally depend on many factors, e.g., such as the material characteristics of the face stock 20, adhesive layer 22 (if used) and fiber segments or structures 30; the thickness of the face stock 20 and the adhesive layer 22 (again, if used); the fiber/structure packing density; etc.

Optionally, the overall construction 10 may also be further enhanced by first placing or depositing the main fiber segments and/or structures 30 onto a shrinkable substrate or face stock 20 (e.g., a heat-shrinkable film). After the attachment process, the face stock 20 is then optionally shrunk; thereby both increasing the fiber/structure density on the surface of the face stock 20 and optionally improving the fibers' orientation.

Another aspect of the constructions 10 disclosed herein involves the organization of the main fiber segments and/or structures 30 into lamellar patterns (e.g., as shown in FIGS. 7 and 9). Notably, such patterns are detected for instance on the underside of the feet of geckos, where the setae are packed onto rows of ridge like structures. Suitably, organization of main fiber segments and/or structures 30 into rows is readily accomplished by utilizing face stock 20 with adhesive 22 coated thereon in the desired patterns.

With respect to the micro-scale architectures (i.e., structures 30) obtained, e.g., by the use of bi-component fiber segments as disclosed herein, it is noted that INS type or other like bi- and/or multi-component fibers capable of being split or fibrillated with main fiber diameters in the range of approximately 10 μm to approximately 50 μm and various sea-island polymer combinations are suitable. The main fiber diameters employed will generally depend on the characteristics of the polymers and the desired number and diameters of the island fibers. One example of an INS type fiber that may optionally be employed has a main fiber diameter of approximately 10 μm with island fiber diameters in the range of approximately 200 nm to approximately 2000 nm. Another example of an INS type fiber that may optionally be employed has a main fiber diameter of approximately 50 μm with island fiber diameters in the range of approximately 75 nm to approximately 130000 nm. Bi-component fibers including islands-in-the-sea (INS) type bi-component fibers are commercially available from several vendors, e.g., such as Hills Inc., Kuraray and Kolon Industries. From the perspective of gecko-mimetic constructions, INS fibers which are particularly suitable include those where the island components possess diameters in a range of between approximately 1 nm and approximately 1000 nm and the number of islands per INS fiber is in the range of approximately $10^2$ to approximately $10^5$. More specifically, INS fiber having diameters in the range of approximately 1 μm to approximately 100 μm are particularly beneficial for selected applications. Examples of suitable sea-island material combinations that may be used include polyvinyl alcohol-polypropylene, polyvinyl alcohol-polyester, polyvinyl alcohol-nylon, polyethylene-polyester and polyester-polypropylene.

In any event, the fabrication of selected embodiments disclosed herein yield bio-mimetic fiber based dry adhesive constructions with multilevel hierarchical architectures. The structures thus fabricated will therefore deform and conform to surfaces over multiple length scales.

Figure 14:
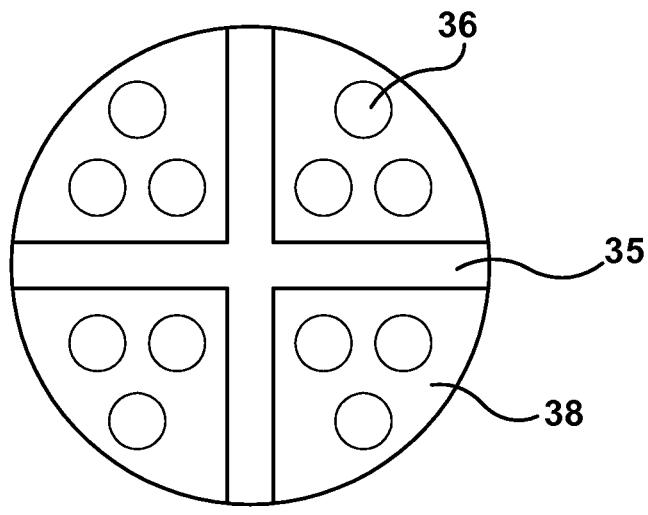
FIG. 14 a is schematic illustration shown an end view of a three component INS type fiber that may optionally be used the micro- and/or nano-sized structure in accordance with one of the embodiments disclosed herein.
Figure 15:
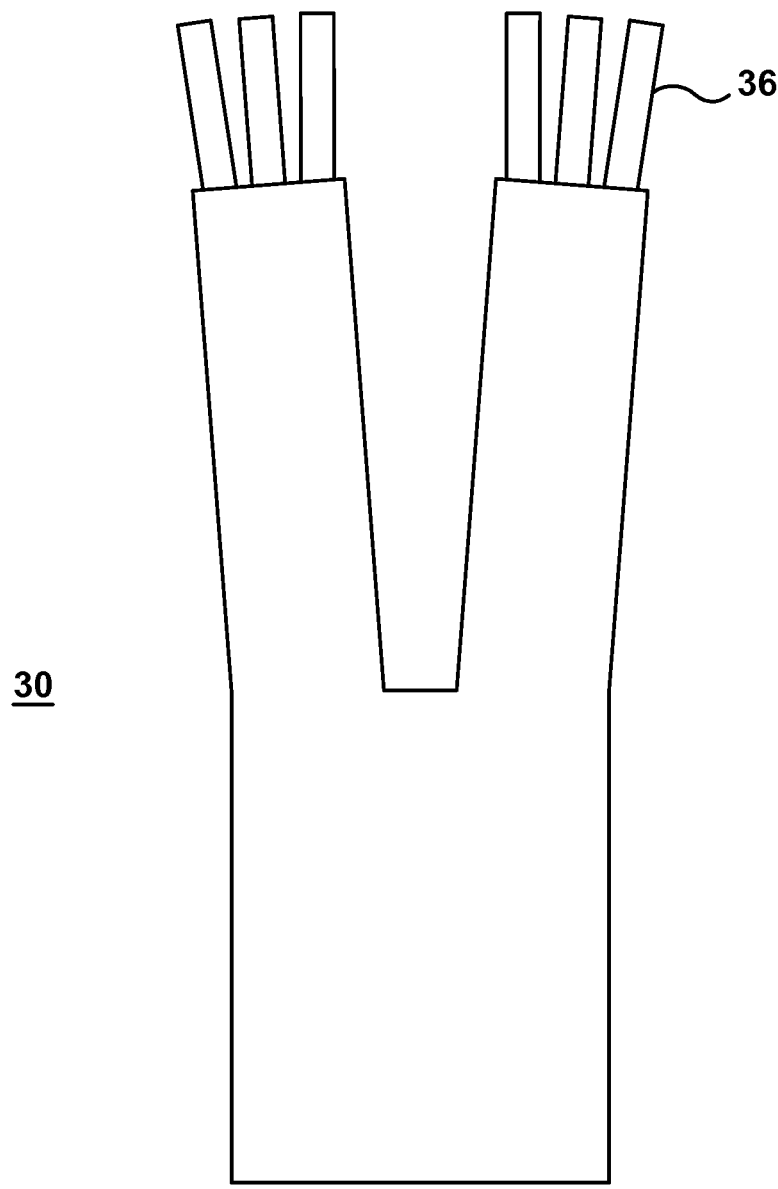
FIG. 15 is a schematic illustration a side view of the INS type fiber illustrated in FIG. 14, wherein a hierarchical structure has been created with progressively smaller branching.

While other embodiments disclosed herein illustrate only two levels of hierarchical organization or branching—namely a first or base level (generally equating to the un-fibrillated main fiber segments or structures 30), and a second level atop the base level (generally equating to fibrils 39 form at the distal ends 34 of the fiber segments and/or structures 30), in practice, any number of multiple levels may be created or formed. Suitably, for example, as shown in FIGS. 14 and 15, each structure 30 forms a hierarchical organization of features which branch into progressively smaller dimensions. For example, this hierarchical architecture is optionally formed at the distal end 34 of the fibers. Optionally, each successive branch of the multi-level hierarchical organization has a progressively smaller diameter, circumference or other outer perimeter. Suitably, one or more branches extend from and/or are formed on each underlying level or branch. For example, as seen in FIG. 15, the base of the structure 30 may remain un-fibrillated, while the next level of the structure 30 atop the base is fibrillated into smaller fibers, while the next level of the structure 30 atop these smaller fibers, is yet again fibrillated into even smaller fibrils, and so on for as many levels as the hierarchical architecture has. Suitably, the multi-level hierarchical branching is achieved by using a multi-component fiber segments, e.g., such as the one shown in FIG. 14. Accordingly, each branch level is formed by removing one or more of the components, e.g., using any one or more of the above-mentioned techniques. For example, in the illustrated embodiment, the sea material 34 may be removed to expose the island material 36, thereby forming the finest set of branches or fibrils 39. Similarly, the third material 35 may be removed to yet again fibrillate the main fiber segment or structure 30 into multiple secondary branches (i.e., each have a plurality of the fibrils 39 formed on the distal end thereof).

The present specification will now detail exemplary fabrication methods with particular reference to the aforementioned flocking method and bundling method.

Making Constructions 10 with Functional Surfaces 12 Via Electrostatic Flocking

1) INS Fibers: As mentioned earlier, islands-in-the-sea (INS) fibers with many combinations of island and sea polymers are commercially available. INS fibers with two, three or more components can be used for the fabrication of patterned and/or functional surfaces. The sea and/or island components can be rendered electrically conductive through the addition of, e.g., a) ionic compounds, and/or b) electrically conductive particles such as metal micro- and/or nano-particles, and/or c) carbon micro- and/or nano-tubes, and/or d) carbon micro- or nano-particles, and/or e) graphite micro- or nano-particles, and/or f) conducting polymers including those belonging to the polyanilines or polythiophenes groups, to the sea and/or island polymers prior to spinning of the INS fibers. When the INS fibers are thus rendered electrically conductive, additional processing steps to coat the fibers with a conductive material prior to electrostatic flocking becomes redundant. INS fibers with a protective sheath polymer can also be produced via the fiber spinning process. This protective sheath functions as a barrier that prevents the sea polymer on the sides of the INS fibers from being dissolved by the solvent during the splitting or fibrillation process. The solvent induced fibrillation process is optionally conducted as follows when such a protective coating is present. First, the sea polymer is etched away with a suitable solvent to expose the nano-fibers, and following this the protective coating is rinsed off to the extent desired also with a suitable solvent. The sea and protective coating may consist of the same polymer or may consist of different materials. Additionally, the sea and protective polymers may be chosen so as to be soluble in the same solvent or different solvents. Finally, the sea polymer, and when present the protective sheath polymer, can be chosen to be solvent- or heat-fusible to allow bonding of the fibers to either the adhesive 22 or the face stock 20 or if desired to facilitate bonding of a group of INS fibers to each other. Alternatively, a separate solvent- or heat-fusible layer can be introduced during the fiber spinning process.

2) Coating of the INS Fibers: Following spinning of the INS fibers the fibers can optionally be coated with a conductive material in the cases where the fibers themselves are not made intrinsically conductive. Such a coating can be introduced for example by soaking the INS fibers in an aqueous solution of an ionic compound or ionic compounds, followed by drying the fibers. Alternatively, the INS fibers can be coated with a solution of a conducting polymer, following which the fibers are dried. Another possibility is that the fibers are coated with conducting particles by soaking the fibers in a solvent suspension of the conducting particles followed by drying the fibers. In the cases where the INS fibers are not coated with a protective sheath polymer during the fiber spinning process, such a protective sheath coating can be introduced onto the fibers by passing the fibers through a bath containing a solution of a suitable polymer, followed by the drying the fibers. The same method can be used to introduce a solvent- or heat-fusible coating in the instances where such a coating is not introduced during the fiber spinning process.

3) Electrostatic Flocking Process: Suitable INS fibers are chopped to the desired lengths and then further processed where applicable to render them conductive and/or to prevent the chopped fibers from clumping together. The resulting fiber segments are then subjected to electrostatic flocking. The electric field strength used for the flocking process can optionally be increased to yield improved more uniform fiber orientations and/or to increase the density of the flocked fiber segments. The electrostatic flocking process itself can be accomplished optionally in one of two modes. In the first mode, the flock fiber segments fall downwards under the influence of the applied electric field and gravity and penetrate into the adhesive coated face stock 20 or the incipient face stock 20, e.g., which is in a molten, solution or uncured form. In the second mode, the flocked fiber segments are placed below the web and fly upwards under the influence of the applied electric field and penetrate into the adhesive coated face stock 20 or the incipient face stock 20, e.g., which is in a molten, solution or uncured form. Prior to adhesive or face stock curing or drying, the flocked fiber segments can be aligned at specific desired angles with respect to the face stock 20, e.g., through use of air jets or simply through a smoothing motion type contact with a plastic or metal sheet. The adhesive or face stock is then cured or dried following the alignment of the flocked fiber segments.

4) Adhesion of Flocked Fiber Segments to the Face Stock: Various types of adhesives 22 belonging to the broad classes including emulsion adhesives, solvent adhesives or 100% solids adhesives can optionally be used to bond the flocked fiber segments to the face stock 20. The adhesives can be made to set through the removal of water in the case of emulsion adhesives or the solvent in the case of the solvent based adhesives. The adhesives in addition can be chosen so as to be thermally curable or radiation curable, e.g., through the use of ultraviolet light or an electron beam. Hot melt or thermoplastic materials may also be used for the purpose of bonding the flocked fiber segments to the face stock 20. In this case, the molten polymer is coated onto the face stock 20 and while the polymer is molten the flocked fiber segments are introduced, following which, the polymer is allowed to cool and bond the flocked fiber segments in place.

5) Processing Following Flocking: Once the fiber segments are flocked and bonded to the face stock 20, they can optionally be further trimmed or shaved if desired to achieve uniform lengths. In the case that a heat shrink elastomeric face stock 20 is used, the face stock 20 can be shrunk to increase the density of flocked fiber segments.

6) Splitting or Fibrillation Process: Several methods for the fibrillation of INS type fiber materials have been detailed earlier herein, and any one or more of the same may be used in this instance after the flocking process. In addition, fibrillation of the INS fiber segments can also be achieved by choosing the sea polymer such that it is selectively susceptible to degradation relative to the polymer(s) comprising the island fibrils upon exposure to oxygen plasma or ultraviolet light or electron beam irradiation. If desired, additional rinse and drying steps can be performed to remove the degradation products. Another option for splitting or fibrillating INS fibers is to mechanically rub the surface, thereby stressing the INS fibers and causing them to split apart.

7) Post Processing: It was noted earlier that fibrillation of INS fiber segments could optionally be accomplished through the controlled partial dissolution of the sea polymer and, when present, the protective sheath polymer. It was also noted that during the dissolution and subsequent drying steps, groups of micrometer sized fiber segments and/or groups of nanometer sized fibrils could stick or clump together. Clumping may occur because as the solvent volatilizes the volume decreases and concomitantly the surface tension at the fiber-liquid interface may pull the micrometer sized fiber segments and/or nanometer sized fibrils together. Generally, clumping is an undesired phenomenon which can optionally be mitigated or eliminated by carefully choosing, for a given INS fiber diameter, sea and island polymer materials with the appropriate modulus and by cutting the flocked fiber segments to appropriate lengths. Similar considerations would apply, in the case of the nanometer sized fibrils. That is, for a given nano-fiber diameter, a material of the appropriate modulus can optionally be chosen, and, on an average appropriate nano-fiber lengths can also optionally be generated by the fibrillation process. In addition to the aforementioned measures, or separately, critical point drying or supercritical drying can optionally be applied to the flocked materials following solvent induced fibrillation to mitigate or eliminate clumping of the micrometer sized fibers and/or the nanometer sized fibrils.

As mentioned above, in still another embodiment disclosed herein, a bundling method is employed for forming bio-mimetic micro- and/or nano-scale surfaces. In accordance with this method, cables or bundles of a plurality of bi- and/or multi-component fibers (e.g., INS fibers) are secured or held together with an optional binding agent and/or element. The method then involves slicing these bundles along the cross-section to form thin disks or wafers 54. The slicing is optionally done at various angles to the cross-section of the bundle. The resulting wafer 54 is then secured to the substrate or face stock 20 and the binding agent and/or element released or removed so that the individual fiber segments are no longer secured together. At this point in the process, the individual multi-component fiber segments (e.g., INS fiber segments) can be subjected to further steps as disclosed above, such as splitting the ends of the surface-bonded fibers through removal of the sea polymer or by mechanical cutting means. As can be appreciated with reference to FIG. 13, the angle at which the bundle 56 is sliced will dictate the angles at which the fiber segments are bonded to the substrate.

In one particular embodiment, as illustrated in FIG. 11, a fiber bundle may be formed by disposing a plurality of fibers 50 within a shrinkable tube 52 (e.g., such as a heat-shrinkable tube) and then shrinking the tube 52 so as to secure the fibers 50 therein strongly enough to allow subsequent slicing of the fiber bundle 56 as described herein.

In another embodiment, the bundle of fibers 50 may be secured together by dipping them into an appropriate solution such as a solvent based polymer, then drying the bundle to solidify the solution and thus securely fastening the fibers 50 together. One particular solution that may be employed is Butvar™ resin available from Solutia of St. Louis, Mo. Optionally, after dipping, the fiber bundle may be squeezed to mechanically remove any excess solution prior to drying.

An additional, optional step that may be employed with both of the above embodiments is to dip the bundle into a low surface energy solution. By employing this step, subsequent fiber splitting operations will generally only split at the ends, e.g., upon rinsing away of the sea polymer in each individual INS fiber segment.

Additionally, fiber bundles created by any of the means described herein may be further secured together to create an even larger bundle, thus yielding even larger surface-area wafers.

Splitting the bi-component or INS fiber segments after they are attached to the substrate or face stock 20 may be accomplished, e.g., by dipping into a solvent solution (such as an aqueous solution of NaOH). Suitably, the concentration of solvent can be varied in relation to the material properties of the fiber components. Optionally, the temperature of the solution may also beneficially be controlled during the splitting process. When the desired degree of fibrillation is achieved, the fiber segments can then be washed with water to remove the solvent and dried, e.g., such as in a desiccant chamber. For instance, fibers bundle in a Butvar solution may be dipped for six minutes in a NaOH solution at 90° C. to create a selective opening at the end of the fiber segments. By reducing the time exposed in the NaOH solution to three minutes, the splitting can be controlled to happen only at the very end of fiber segments. NaOH pellets instead of solution can be used to lengthen the splitting or fibrillation process.

Suitably, a drying process (e.g., which is optionally accomplished with air or nitrogen) is executed after the sea polymer has been dissolved and the fiber segments rinsed, e.g., with water. During this drying process, capillary forces from water droplets may clump fibers and/or fibrils together, which are then likely to stay together when completely dry due to Van der Waals forces. Thus, in further embodiments contemplated herein, the drying process may employ supercritical drying (i.e., a drying process that operates beyond the critical point of the working fluid in order to avoid the direct liquid-gas transition that occurs in ordinary drying). Alternatively or additionally, the split or fibrillated fiber segments may be subjected to a mechanical force across their split or fibrillated ends (such as by being rubbed against a surface) either during or after drying, to thereby prevent and/or break-up the formation of clumps.

Making Constructions 10 with Functional Surfaces 12 Via the Bundling Method 1) INS Fibers: As mentioned earlier, islands-in-the-sea (INS) fibers with many combinations of island and sea polymers are commercially available. INS fibers with two, three or more components can be used for the fabrication of patterned and/or functional surfaces. INS fibers with a protective sheath polymer can also be produced via the fiber spinning process. This protective sheath functions as a barrier that prevents the sea polymer on the sides of the INS fibers from being removed during the splitting or fibrillation process. The solvent induced fibrillation process is optionally conducted as follows when such a protective coating is present. First, the sea polymer is etched away with a suitable solvent to expose the nano-fibers or island polymer, and following this the protective coating is rinsed off to the extent desired, e.g., also with a suitable solvent. The sea and protective coating may consist of the same polymer or may consist of different materials. Additionally, the sea and protective polymers may be chosen so as to be soluble in the same solvent or different solvents. Finally, the sea polymer, and when present the protective sheath polymer, can be chosen to be solvent- or heat-fusible to allow bonding of the fiber segments to either the adhesive 22 or the face stock 20 or if desired to facilitate bonding of a group of INS fibers to each other. Alternatively, a separate solvent- or heat-fusible layer can be introduced during the fiber spinning process.

2) Coating of the INS Fibers: In the cases where the INS fibers are not coated with a protective sheath polymer during the fiber spinning process, such a protective sheath coating can be introduced onto the fibers by passing the fibers through a bath containing a solution of a suitable polymer, followed by drying the fibers. The same method can be used to introduce a solvent- or heat-fusible coating in the instances where such a coating is not introduced during the fiber spinning process. Solutions of polymeric materials that can bind the fibers to each other upon removal of the solvent can also be introduced onto the fibers by coating the fibers or yarns with the solution prior to bundling the fibers. Materials that can be used for this purpose include, e.g., a) embedding resins that are used for microscopy, b) UV (ultraviolet) resists (where the removal of the binder can be precisely controlled by varying the exposure time and intensity of the UV light), c) thermal, electron beam or UV curable resins etc.

3) Bundling Process: Suitably, the fibers 50 are first oriented (see, e.g., FIG. 11). Longitudinal orientation of fibers 50 can be very simply achieved for example by unwinding bobbins while applying tension on the loose ends of the yarn while bunching them together. When desired, a protective, heat- or solvent-fusible, or other binder coating is applied to the yarns before bunching them together, e.g., as described in process 2) above. The bunched or collected yarns are placed into a heat shrink tubing 52 of the desired diameter, shrink characteristics etc. Following this, the construction is heated to the appropriate temperature so as to shrink the heat shrink tubing 52. The fibers 50 are thus compacted and axially oriented. When a heat fusible coating is employed, the construction is also suitably exposed to a temperature sufficient to cause the heat fusible coating to soften or melt thereby engendering fusion. The construction is cooled to yield a rod of axially oriented bonded fibers, e.g., which is suitably stiff enough for slicing as described herein.

4) Adhesion of Bundled Fiber Segments to the Face Stock: Various types of adhesives 22 belonging to the broad classes including emulsion adhesives, solvent adhesives or 100% solids adhesives can optionally be used to bond the bundled fiber segments to the face stock 20. The adhesives can be made to set through the removal of water in the case of emulsion adhesives or the solvent in the case of the solvent based adhesives. The adhesives in addition can be chosen so as to be thermally curable or radiation curable, e.g., through the use of ultraviolet light or an electron beam. Hot melt or thermoplastic materials may also be used for the purpose of bonding the bundled fibers or fiber segments to the face stock 20. In this case, the molten polymer is coated onto the face stock 20 and while the polymer is molten the bundled fibers or fiber segments are introduced, following which, the polymer is allowed to cool and bond the bundled fibers or fiber segments in place.

5) Fiber Bundle Slicing: The fiber bundles 56 can be sliced, for example with a blade apparatus, either perpendicular or at any other desired angle with respect to the long axis of the bundles. The fiber bundle slicing operation can be executed after the bundles are bonded to the face stock 20. Alternatively, the bundles can be sliced first, and the slices are then bonded to the face stock 20.

6) Post Processing: Suitably, the heat shrink tubing 52 can be removed (e.g., in the instance where the fibers and/or fiber segments are not bonded to each other) after the fibers or fiber segments have been firmly bonded to the face stock 20, or alternately (e.g., in the instance where the fibers or fiber segments are bonded to each other), the heat shrink tubing 52 can be removed prior to bonding of the fibers or fiber segments to the face stock 20. Once the fibers or fiber segments have been bonded to the face stock 20, additional steps such as shaving or trimming the fibers can be executed if desired. Optionally, the face stock is made of a shrinkable elastomeric material. Accordingly, after the bonding process, the construction 10 or face stock 20 is treated (e.g., via heat, UV light, an electron beam or other suitable radiation, etc.) so as to cause the face stock 20 to shrink. This in turn has the effect of increasing the fiber segment density on the surface of the face stock 20.

7) Splitting or Fibrillation Process: Several methods can be employed for the splitting or fibrillation of bundled INS fibers.
  a) When the INS fibers contain a solvent soluble sea polymer, splitting or fibrillation is optionally conducted by dissolution of the sea polymer. When the bundle constructions additionally contain the optional solvent soluble protective coating or binder, the sea polymer is first dissolved, and then the protective polymer or binder is dissolved. In this instance, the sea, protective coating and binder polymers are chosen so as to have different solvent solubility characteristics. The materials can also optionally be chosen such that sea, protective coating and binder can be simultaneously removed.
  b) When the INS fibers contain a shrinkable sea polymer, the sea polymer can be shrunk, e.g., by exposing the construction to heat or electron beam irradiation, whereby fibrillation will be induced upon shrinking the sea polymer.
  c) When the sea polymer consists of materials susceptible to selective degradation, the construction is optionally exposed to oxygen plasma, UV light etc. so as to induce degradation of the sea polymer, which will result in exposure of the island fibrils. If desired, additional rinse and/or drying steps can be performed to remove the degradation products.
  d) Another option for splitting or fibrillating the INS fiber segments is to mechanically rub the surface, thereby stressing the INS fiber segments and causing them to split apart.

8) Post Processing: It was noted earlier that fibrillation of INS fiber segments could optionally be accomplished through the controlled partial dissolution of the sea polymer and, when present, the protective sheath polymer. It was also noted that during the dissolution and subsequent drying steps, groups of micrometer sized fiber segments and/or groups of nanometer sized fibrils could stick or clump together. Clumping may occur because as the solvent volatilizes the volume decreases and concomitantly the surface tension at the fiber-liquid interface may pull the micrometer sized fiber segments and/or nanometer sized fibrils together. Generally, clumping is an undesired phenomenon which can optionally be mitigated or eliminated by carefully choosing, for a given INS fiber diameter, sea and island polymer materials with the appropriate modulus and by cutting the flocked fiber segments to appropriate lengths. Similar considerations would apply, in the case of the nanometer sized fibrils. That is, for a given nano-fiber diameter, a material of the appropriate modulus can optionally be chosen, and, on an average appropriate length of the nano-fiber can also optionally be generated by the fibrillation process. In addition to the aforementioned measures, or separately, critical point drying or supercritical drying can optionally be applied to the flocked materials following solvent induced fibrillation to mitigate or eliminate clumping of the micrometer sized fibers and/or the nanometer sized fibrils.

The following are examples of constructions fabricated in accordance with selected embodiments disclosed herein. In these examples: PLA (polylactic acid)/PP island-in-sea (INS) 156 denier/72 filaments fibers were obtained from Hills Inc. and consisted of 80% polylactic acid (sea) and 20% polypropylene (island); shrink PVC (polyvinyl chloride) tubes having approximately 2 to 1 shrinkage ratio at 121° C. were obtained from alpha FIT, FIT KIT-221BK; PEG (poly(ethylene glycol)) of different grades, DER 331 epoxy resin, DER 732 epoxy resin, D.E.H 24, Tergitol™ NP-13 were obtained from Dow Chemical Company; and glycol triacetate and 2-ethyl-1,3-hexanediol were obtained from Sigma-Aldrich. The term "fiber bundle" as used with respect to the examples denotes weighted PLA/PP INS fibers aligned parallel to each other.

Making a binder solution: each binder formula was heated up to approximately 90° C. and then cooled down to approximately 70° C. followed by placing the container with the binder into a hot water bath prior to coating the PLA/PP fibers.

Coating and slicing fiber bundles: weighted fiber bundles were incubated for approximately 5 min. in the binder solution. Fiber bundles then were passed through a proper sized heat shrink tube, and placed in an oven at approximately 121° C. for approximately 3 min. to allow the tube to shrink. Thereafter, the bundle was brought to room temperature to harden. Once parallel oriented and coated INS fibers had been hardened in the heat shrink tube, the tube was sliced into rings having a thickness of approximately 600 microns. Single edge blades with an edge of approximately 0.009" from Extra Keen were used to cut the shrink heat tubes. A Semprex Motorized Stage Controller and AMICron software were used to achieve cutting precision.

Preparation of epoxy web: an epoxy web was prepared by coating the mixture of epoxy resins and triethylene tetramine (D.E.H 24) with thickness of approximately 0.5 mil onto PET film. Epoxy resin consisted of a mixture of DER 331 (i.e., a reaction product of epichlorohydrin and bisphenol A) with DER 732 (i.e., a reaction product of epichlorohydrin and polypropylene glycol) in the ratio of 7:3 accordingly.

Example 1. Bundling with a Heat Shrinkable Tube

An approximately 3 g fiber bundle with a length of approximately 12 inches was folded and pulled through an approximately ¼ inch in diameter heat shrink tube. The tube was placed in an oven at 121° C. for 1 minute. Using single edge blades with an edge thickness of approximately 0.009" from Extra Keen, the tube was sliced into 1 mm thick rings. As the parallel aligned PLA/PP fiber segments were supported by the PVC heat shrink ring, they did not fall apart. The 1 mm thick parallel aligned INS fiber segments were then placed in an acetone solution and sonicated using an Ultrasonic Cleaner Branson 1210. Sonication in acetone for approximately 3 minutes generated fibrillated polypropylene nano-fibers having diameters of approximately 200 nm and approximately 500 nm-5 microns in length.

Example 2. Bundling with a Binder Solution

A binder was composed of approximately 70 g of Carbowax™ PEG 8000 (flake) and approximately 30 g of Carbowax™ Sentury™ PEG 1000 (flake) and prepared according to the "making a binder solution" procedure described above. Fiber bundles were coated and sliced according to the "coating and slicing fiber bundles" procedures described above to create rings or wafers. An epoxy web was prepared according to the "preparation of epoxy web" procedure described above. The rings or wafers were then assembled on the epoxy web, and the web was left overnight to cure. Samples of the INS fiber rings or wafers cured on the epoxy web were placed in an acetone solution and sonicated for 3 min. in an Ultrasonic Cleaner Branson 1210.

It was noted that lower molecular weight PEG provides a higher solubility rate in acetone. Adjusting the solubility rate of the PEG binder with the solubility rate of PLA sea polymer, the fibrillating technique of simultaneous removing binder and sea polymer was developed using acetone as a solvent. It was also noted that clumping of the polypropylene nano-fibers is negligible when the length of fibrillated nano-fibers is less then approximately 500 nm.

Example 3. Effect of Ethoxylated Nonylphenols (Tergitol NP-13), Glyceryl Triacetate and 2-ethyl-1,3-hexanediol on Fibrillating Technique Binder formulas with additives are listed in Table 2.

TABLE 2

| Components | Binder A, g | Binder B, g | Binder C, g | Binder D, g |
|---|---|---|---|---|
| Carbowax sentry PEG 1450 | 50 | 45 | 45 | 45 |
| Carbowax PEG 4000 | 50 | 45 | 45 | 45 |
| Tergitol TM NP-13 | — | 10 | — | — |
| Glyceryl triacetate | — | — | 10 | — |
| 2-ethyl-1,3-hexanediol | — | — | — | 10 |

Each formula was prepared according to the "making a binder solution" procedure described above. Fiber bundles were coated and sliced according to the "coating and slicing fiber bundles" procedures described above to create rings or wafers. An epoxy web was prepared according to the "preparation of epoxy web" procedure described above, and the rings/wafers were then assembled on the epoxy web. The web was left overnight to cure. Samples of INS fiber rings/wafers cured on the epoxy web over night were then placed in an acetone solution followed by sonication for 3 min. in an Ultrasonic Cleaner Branson 1210.

It was found that Binder A had very poor stress endurance but Binders B, C, and D showed less stress cracking when sliced down to approximately 600 microns. Binder B did not show any significant impact on the fibrillating washing technique, but adding glyceryl triacetate or 2-ethyl-1,3-hexanediol in the binder formulation appeared to prevented INS fibers from achieving clean fibrillation during the 3 minutes of sonication. Furthermore, it was noted that ethoxylated nonylphenols (Tergitol NP-13) tended to act as a surfactant for the polypropylene nano-fibers, therefore less clumping was observed.

Example 4

The fibrillating technique was produced in the same manner as in Example 3 with Binder B except that the angle cut was altered to 30 degrees. The cutting procedure was adjusted using the AMICron software with Semprex Motorized Stage Controller.

Example 5

Two INS flock fibers, F1 (Rojel from Kolon Industries) and F2 (Rojel-μ from Kolon Industries) were cut to approximately 0.381 mm long and treated for DC flock by Claremont Flock. Adhesive FL1059B from Noveon was diluted using an approximately 4:1 adhesive:water ratio, and coated onto a PET film using #60 and #100 Meyer Rods, which yields approximately 0.025 mm and approximately 0.064 mm thick dry adhesive thicknesses. The fiber segments were then flocked onto the adhesive coated PET substrate. The flocking procedure used was as following:

(1) Apparatus Used: DC—Hand Held "Mini-Flocker" (Maag-Flockmaschinen Model HEK 100) having an approximately 20 cm diameter Applicator fitted with an approximately 0.75 mm mesh size nylon screen insert.

(2) Conditions: at approximately 70 KV, the Applicator was held approximately 4" to 6" from grounded samples (these conditions result in a field strength of approximately 5 to 7 KV/cm).

(3) Procedure:
(a) Screen-sift a weighed amount of flock directly into the flock applicator chamber.
(b) Affix the applicator screen (0.75 mm opening nylon mesh) onto the applicator chamber.
(c) Using a PSA (pressure sensitive adhesive) tape, secured an approximately 12"×14" sheet of approximately 0.002" thick PET film onto a glass plate, underlaying the film with an aluminum foil.
(d) Using a clean Meyer Rod of the desired wet film thickness, coated the film with the particular water based adhesive.
(e) Remove the adhesive coated film and aluminum foil underlay from the glass (coating) plate, using care to keep the coated film flat, and placed it in the flocking booth.
(f) With the flocking booth vacuum blower operating, carried out the flocking process by vigorously (short strokes) shaking the 70 KV activated flock applicator evenly (4" to 6") above the (wet) adhesive coated PET film until all the flock has been dispensed from the flock applicator chamber.
(g) Carefully removed the flocked PET film sample from the flocking booth and placed it on a flat table for quiescent drying (overnight).
(h) After this overnight drying process, the surface of each flocked PET film sample was carefully vacuumed to remove any loose flock fibers.
(i) These vacuumed flock samples are then "Post Cured" in an oven e.g. 3 to 5 minutes at 133° C.
(j) These flocked PET film samples were then tested.

The flock density was calculated based on the equation:

$$\text{Flock Density(fibers/mm}^2) = \frac{[\text{total grams of flock in the } 6'' \times 6'' \text{ area}]}{[\text{grams of one flock fiber}][23226]}$$

Pull-out forces of blocked fibers were measured using a Maag Flockmachinen Model 100 flock adhesion tester manufactured by Maag-Flockmaschinen, GmbH of Gomaringen, Germany. The flock density and pull-out forces are summarized in the following Table 3.

TABLE 3

| Flock Fiber Designations | Adhesive Thickness (mm) | Flock Density(a) (fibers/mm²) | Pull-Out Force (Newtons) | Type of Failure |
| --- | --- | --- | --- | --- |
| F-1 | 0.025 +/− 0.003 | 900 | 57 +/− 14 | mixed/peel |
| F-1 | 0.064 +/− 0.008 | 1600 | 83 +/− 18 | peel from PET film |
| F-2 | 0.025 +/− 0.003 | 1300 | 48 +/− 10 | mixed/peel |
| F-2 | 0.064 +/− 0.008 | 1600 | 64 +/− 25 | Peel from PET film |

Figure 16:
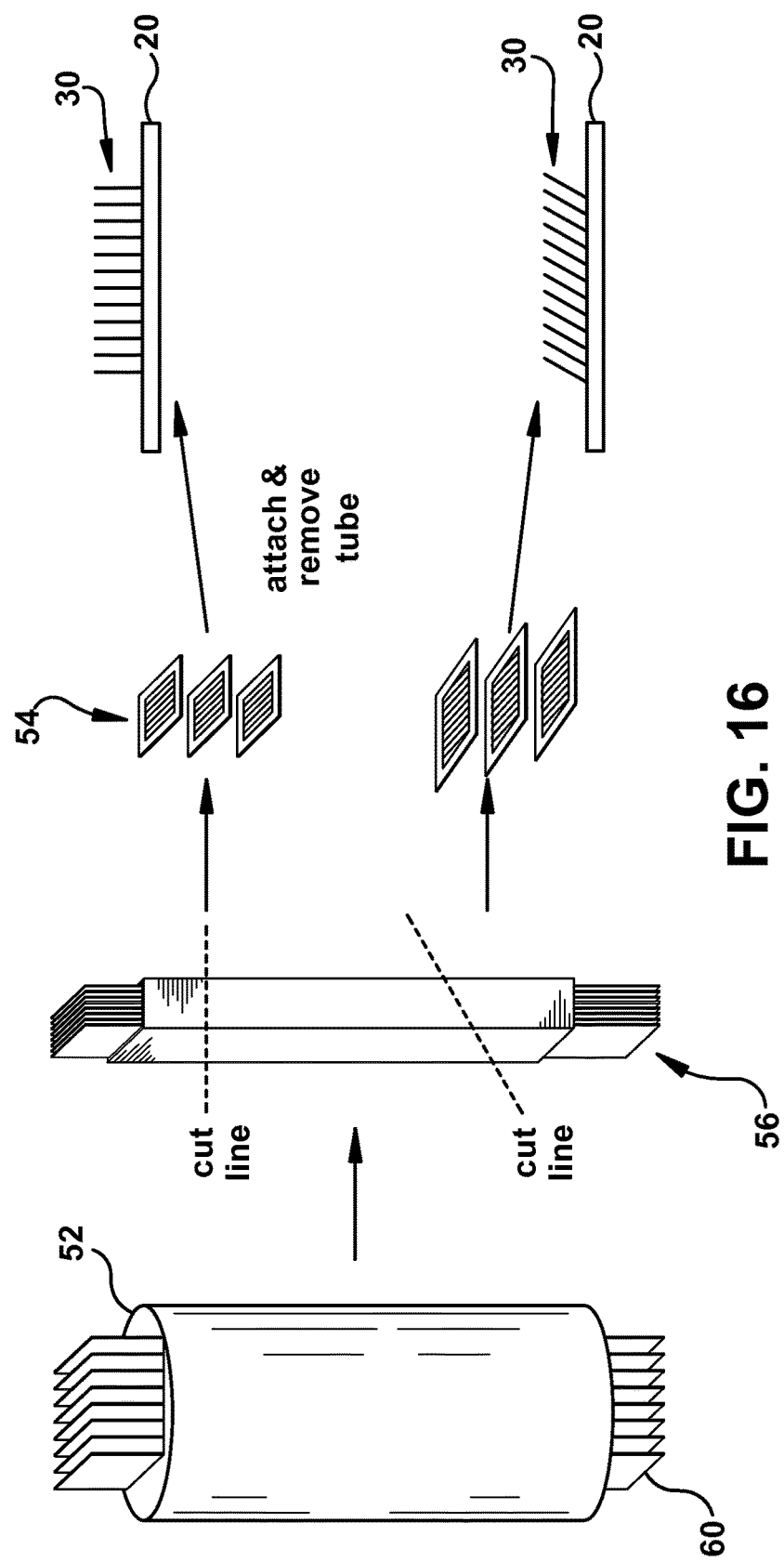
FIG. 16 is a schematic illustration showing a substantially similar process as shown in FIG. 11, except that the fibers are replaced by stacked ribbons.
Figure 17:
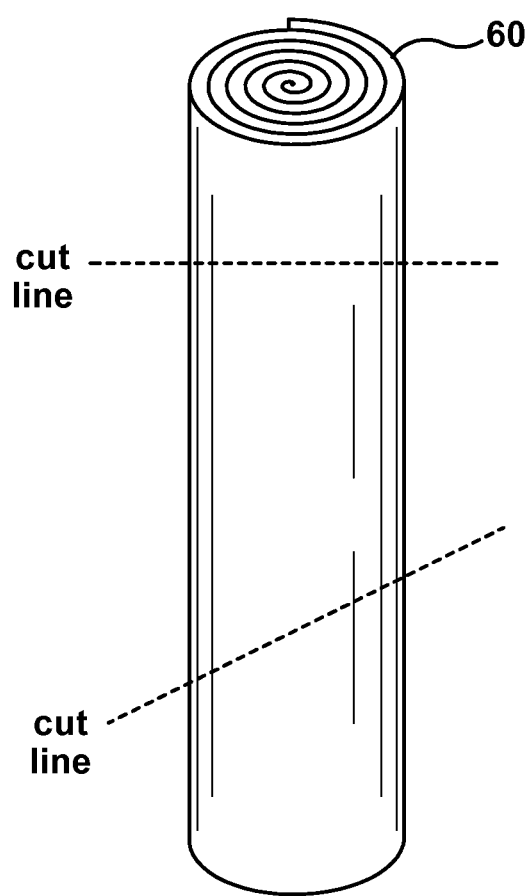
FIG. 17 is a schematic illustration showing an alternate embodiment of the process shown in FIG. 16, wherein a single ribbon rolled-up upon itself replaces the stack of ribbons shown in FIG. 16.

The forgoing disclosure generally refers to the structures 30 as being made from fibers or fiber segments. However, it is contemplated that the structure 30 may be formed from elements other than fibers or fiber segments. For example, as show in FIGS. 16 and 17, the structures 30 may be formed from ribbons 60 or sections thereof. In particular, one or more ribbons 60 may be bound and/or otherwise securely held in similar fashion to the fibers 50 as shown in FIG. 11, e.g., via a binder and/or shrunken shrink tube 52. Suitably, as shown in FIG. 16, a plurality of ribbons 60 may be stacked one next to the other, such that when the tube is sliced, a laminar arrangement of ribbon sections is produced. Alternately, as shown in FIG. 17, a single ribbon 50 may rolled-up and encased in the tube 52 or otherwise held, such that when the tube is sliced, a spirally shaped ribbon section is produced. In either case, the tube may be sliced perpendicular to the longitudinal axis or at an angle to achieve the desired orientation of the ribbon segments when they are bond or otherwise attached to the substrate or face stock 20.

In any event, it is to be appreciated that in connection with the particular exemplary embodiment(s) presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof.

What is claimed is:

1. A method of fabricating a construction having at least one functional side, said method comprising the steps of:
   (a) providing a flexible substrate having a surface facing the functional side of the construction;
   (b) attaching one or more structures to the surface of said substrate, step (b) including, holding the one or more structures together in a bundle, wherein said holding is achieved by placing the structures in a tube;
   (c) forming one or more features on at least one of the structures, said features having at least one dimension which is at least one of micro-sized or nano-sized; and
   (d) shrinking the tube around the one or more structures.

2. The method of claim 1, wherein the structures comprise segments of fiber, each fiber segment having opposing proximal and distal ends, and wherein step (b) comprises attaching the proximal ends of the fiber segments to the surface of the substrate.

3. The method of claim 2, wherein step (b) comprises:
   flocking the fiber segments onto the surface of the substrate, wherein said flocking comprises at least one of electrostatic flocking, mechanical flocking or pneumatic flocking.

4. The method of claim 2, further comprising:
   orienting axes of the fiber segments to form desired angles with respect to the surface of said substrate.

5. The method of claim 4, wherein said orienting comprising:
   creating at least one of an electric field, magnetic field or electromagnetic field which applies a force to the fiber segments that urges the fiber segments toward an orientation in which their axes form the desired angles with respect to the surface of the substrate.

6. The method of claim 4, wherein at least a portion of each fiber segment is at least partially one of electrically, magnetically or electromagnetically responsive so as to make the fiber segment reactive to the created field.

7. The method of claim 1, wherein step (b) further comprises:
   producing at least one wafer from the bundle by taking a cross-sectional portion therefrom such that said wafer contains the one or more structures, said structures being one or more segments of the elements held in the bundle; and
   placing the wafer on the surface of said substrate.

8. The method of claim 1, wherein the one or more structures include ribbons or segments of ribbons.

9. The method of claim 1 further including step (e) removing the tube.

10. The method of claim 9, wherein the tube is removed prior to attaching the one or more structures to the substrate.

11. The method of claim 9, wherein the tube is removed after attaching the one or more structures to the substrate.

12. A method of fabricating a construction having at least one functional side, said method comprising the steps of:
   (a) providing a flexible substrate having a surface facing the functional side of the construction;
   (b) attaching one or more structures to the surface of said substrate; and
   (c) forming one or more features on at least one of the structures, said features having at least one dimension which is at least one of micro-sized or nano-sized;
   wherein the structures comprise segments of fiber, each fiber segment having opposing proximal and distal ends;

wherein step (b) comprises:
flocking the fiber segments onto the surface of the substrate, wherein said flocking comprises at least one of electrostatic flocking, mechanical flocking or pneumatic flocking; and
wherein step (c) comprises fibrillating the both ends of the fiber segments prior to said flocking.

\* \* \* \* \*